US008434035B2

(12) United States Patent
Arunachalam

(10) Patent No.: US 8,434,035 B2
(45) Date of Patent: *Apr. 30, 2013

(54) RELATIVE POSITIONING OF CIRCUIT ELEMENTS IN CIRCUIT DESIGN

(75) Inventor: Anand Arunachalam, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/542,048

(22) Filed: Jul. 5, 2012

(65) Prior Publication Data

US 2012/0284682 A1     Nov. 8, 2012

Related U.S. Application Data

(60) Division of application No. 12/506,131, filed on Jul. 20, 2009, now Pat. No. 8,239,792, which is a continuation of application No. 11/138,590, filed on May 26, 2005, now Pat. No. 7,581,197.

(51) Int. Cl.
*G06F 17/50*     (2006.01)
(52) U.S. Cl.
USPC ........... 716/100; 716/103; 716/106; 716/110; 716/119; 716/122; 716/126; 716/132
(58) Field of Classification Search .......... 716/100–106, 716/110–115, 118–126, 132–136
See application file for complete search history.

(56) References Cited

U.S. PATENT DOCUMENTS

| 5,754,826 | A | 5/1998 | Gamal et al. |
| 6,209,123 | B1 | 3/2001 | Maziasz et al. |
| 6,298,469 | B1 | 10/2001 | Yin |
| 6,480,995 | B1 | 11/2002 | Schmidt et al. |
| 7,581,197 | B2 | 8/2009 | Arunachalam |
| 8,239,792 | B2 | 8/2012 | Arunachalam |
| 2005/0076316 | A1 | 4/2005 | Pierrat et al. |
| 2006/0095883 | A1* | 5/2006 | Lakshmanan et al. .......... 716/11 |
| 2006/0190847 | A1 | 8/2006 | Yang et al. |
| 2006/0271894 | A1 | 11/2006 | Arunachalam |

OTHER PUBLICATIONS

V Zyuban et al. "Design Methodology for Low Power High Performance Semi Custom Processor Cores" IBM Research Report, ElectricalEngineeringDec. 10, 2003, pp. 1-25.
J. Lipman "New Tool Adds Horsepower to Datapath Design", EDN Access, Leading Edge Apr. 9, 1998, consisting of two pages.
T. Ye et al. "Physical Synthesis for Asic Datapath Circuits", IEEE International Symposium on Circuits and Systems, pp. 365-368, May 2002.
T. Ye et al. "Data Path Placement with Regularity", International Conference on Computer-Aided Design, pp. 264-270, 2000.

* cited by examiner

*Primary Examiner* — Paul Dinh
(74) *Attorney, Agent, or Firm* — Kenta Suzue; Haynes Beffel & Wolfeld LLP

(57) ABSTRACT

Methods and apparatuses are disclosed for generating a placed, routed, and optimized circuit design. Other embodiments are a circuit design and circuit created with the technology. The placed, routed, and optimized circuit design obeys relative positioning rules of a set of the circuit elements. Such relative positioning rules were created specifically for these circuit elements.

20 Claims, 19 Drawing Sheets

Fig. 18

RELATIVE POSITIONING OF CIRCUIT ELEMENTS IN CIRCUIT DESIGN

RELATED APPLICATIONS

This application is divisional of U.S. application Ser. No. 12/506,131, filed 20 Jul. 2009 by inventor Anand Arunachalam entitled Relative Positioning of Circuit Elements in Circuit Design, which application is a continuation of U.S. application Ser. No. 11/138,590, filed on 26 May 2005 by inventor Anand Arunachalam entitled Relative Positioning of Circuit Elements in Circuit Design. The priority applications are incorporated herein by reference.

BACKGROUND OF THE INVENTION

1. Field

The technology relates to integrated circuit fabrication, and more particularly to placement, routing, and optimization of an integrated circuit design that obeys rules that specify the relative placement of circuit elements.

2. Description of Related Art

An integrated circuit design flow typically proceeds through the following stages: product idea, EDA software, tapeout, fabrication equipment, packing/assembly, and chips. The EDA software stage includes the steps shown in the following table:

| EDA step | What Happens |
| --- | --- |
| System Design | Describe the functionality to implement<br>What-if planning<br>Hardware/software architecture partitioning |
| Logic Design and Functional Verification | Write VHDL/Verilog for modules in system<br>Check design for functional accuracy, does the design produce correct outputs? |
| Synthesis and Design for Test | Translate VHDL/Verilog to netlist<br>Optimize netlist for target technology<br>Design and implement tests to permit checking of the finished chip |
| Design Planning | Construct overall floor plan for the chip<br>Analyze same, timing checks for top-level routing |
| Netlist Verification | Check netlist for compliance with timing constraints and the VHDL/Verilog |
| Physical Implement. | Placement (positioning circuit elements) and routing (connecting circuit elements) |
| Analysis and Extraction | Verify circuit function at transistor level, allows for what-if refinement |
| Physical Verfication (DRC, LRC, LVS) | Various checking functions: manufact., electrical, lithographic, circuit correctness |
| Resolution Enhanc. (OPC, PSM, Assists) | Geometric manipulations to improve manufacturability |
| Mask Data Preparation | "Tape-out" of data for production of masks for lithographic use produce finished chips |

With regard to physical implementation technology, methodologies for structured placement offer circuit designers superior power, yield, and/or area for a given logic function. With the advent of manual placement of transistors, designers created arrayed layouts where logic gates were manually placed in a regularized fashion. This methodology has evolved to the point that automation has been applied to the problem. However, regularized placement still suffers from a great deal of manual effort, such as in cell drive strength selection.

Capturing a priori designer knowledge of structured placement requirements in HDL is a nontrivial problem. Even if captured, structured placement requirements are lost during standard cell random placement. Standard cell placers tend to take more localized views during optimization. This results in not just loss of regularity, but also extra buffering, routing, vias, and cell oversizing, compared to a solution which might be obtained following structured placement.

One approach to this problem is to perform cell sizing and optimization of a structured placement manually through homegrown tools. This approach is quite expensive in terms of engineering effort. This approach is also hard to integrate with the rest of the design. Such integration requires multiple iterations, because standard cell placement and optimization changes the placement, sizing, etc. of the surrounding, non-structured logic. Unfortunately, this triggers another iteration, with further manual sizing and optimization efforts through the homegrown tools for the block with structured placement.

Other approaches to this problem are to generate structured placement through synthesis or through a specific tool, and then pass on the result to a placer through a set of special constraints, or as a macro/IP block. The initial structure generated through synthesis or through the special tool is problematic. Because the initial structure is generated prior to placement, the initial structure is formed lacking complete placement knowledge, and thus the initial structure fails to lead to optimal placement as generation. Also if it is passed as a macro/IP block, then place and route tools cannot resize or otherwise optimize the blocks.

Therefore, it would be desirable to efficiently implement structured placement with circuit design.

SUMMARY OF THE INVENTION

One embodiment is a method of circuit design that generates a placed, routed, and optimized circuit design. Placing and routing is performed for a netlist of a circuit design which includes a set of circuit elements. The set of circuit elements can include, for example, a register, at least part of a datapath of the circuit design, and/or a library element. Optimizing is also performed for at least part of the set of circuit elements, and generally maintains the functionality while improving the circuit design (e.g., timing, size, congestion, wire length, via counts, static power and leakage power). Such optimizing contrasts with other approaches that treat the structured placement portion of a circuit design as an immovable and otherwise unchangeable black box during routing and placement. Some examples of optimizing that involving moving the set of circuit elements, include moving some of the set of circuit elements relative to other circuit elements of the set of circuit elements, and moving the set of circuit elements together to a position in the circuit design.

The placed, routed, and optimized circuit design obeys rules specifying positioning of each circuit element of the set of circuit elements relative to other circuit elements of the set of circuit elements. Such rules contrast with other approaches that simply provide an initial structure that can be violated during subsequent routing, placement, and optimization. These rules were created specifically for the set of circuit elements, in contrast with general rules applied indiscriminately to all circuit elements of every circuit design. By identifying particular circuit elements of the set of circuit elements, the rules can specify one or more gaps between circuit elements, specify orientations of circuit elements, specify pin alignment of the particular circuit elements, forbid removal of a circuit element, specify positioning of a circuit element relative to a design area of the circuit design, and specify (with rows and columns) positioning of the particular circuit elements relative to each other.

The rules can forbid changing a position of any element of the set of circuit elements relative to any other element of the set of circuit elements. In this case, optimizing can still be performed on the set of circuit elements by moving the set of circuit elements all together, to a position in the circuit design. The rules can also specify removal of empty space between circuit elements.

In some embodiments, these rules that specify positioning were created prior to generating the placed, routed, and optimized circuit design. The rules can be created by, for example, a human involved in creating the circuit design, or automatically by a computer analyzing the circuit design. Thus, in the event that a circuit designer feels that the judgment of a circuit designer is superior to rules generated automatically by a computer, the circuit designer can specify such rules. In contrast with other technologies where the circuit designer uses a custom tool to specify such rules, or software such as Mustang by Arcadia creates such rules, and the structured placement result is fed into a place and route tool as an immovable and otherwise unalterable black box, in such an embodiment optimization is performed on at least part of the set of circuit elements that obeys these rules in the placed, routed, and optimized circuit design. Some embodiments include creating the rules, which has the advantage of a more complete solution which combines the rule creation with the generation of the placed, routed, and optimized circuit design. In contrast, other embodiments are more limited, and generate the placed, routed, and optimized circuit design based on rules that are created outside of the embodiment. This has the advantage of being compatible with rules that area created separately from a route and place and/or optimization tool.

In some circumstances, the placed, routed, and optimized circuit design will not be desirable. For example, the rules specifying position may be less than ideal and require tweaking or more drastic revision, or the circuit design itself may require modification, such as the rearrangement of circuit elements, or addition or deletion of circuit elements. Thus, some embodiments perform further iteration of generating a placed, routed, and optimized circuit design, modifying the rules or the netlist.

In some embodiments, the netlist of the circuit design further includes another set of circuit elements unconstrained by the rules. Thus, in this case, the routed, placed, and optimized circuit design includes both circuit elements that obey the rules and circuit elements that are permitted to disobey the rules. Examples of circuit elements that are unconstrained by the rules include a macro, a memory, and random logic of the circuit design. In lieu of obeying the rules, the circuit elements can, for example, be randomly placed and routed. These circuit elements can be optimized, along with the set of circuit elements affected by the rules. In contrast with other approaches that treat the structured placement portion of a circuit design as a black box while generating a routed and placed circuit design or optimizing the circuit design, in some embodiments the optimization of the set of circuit elements affected by the rules is affected by the optimization of the other set of circuit elements that are permitted to disobey the rules, and in some embodiments the optimization of the other set of circuit elements that are permitted to disobey the rules is affected by the optimization of the set of circuit elements affected by the rules. For example, if optimization of the set of elements constrained by the rules results in better congestion, then globally congestion can improve for the other set of circuit elements that are permitted to disobey the rules, resulting in better design utilization. In another example, if a timing critical path of a design runs through both the set of elements constrained by the rules and the other set of circuit elements that are permitted to disobey the rules, then to the extent that that other set of circuit elements that are permitted to disobey the rules has been optimized, optimization will be more effective on the set of elements constrained by the rules, such as by aggressively sizing them to meet timing constraints. In another example, accurate routing estimates for the set of elements constrained by the rules, when compared to the set of elements that are permitted to disobey the rules, will enable aggressive optimization for both sets of elements, thus improving timing for the entire circuit. In another example is, logic optimizations, which are aware of the rules, could reduce the area for the set of the elements constrained by the rules, thus freeing up space for the set of elements permitted to disobey the rules, allowing better timing optimizations, by choosing bigger cells.

In some embodiments, the netlist of the circuit design further includes another set of circuit elements constrained by additional rules. The placed, routed, and optimized circuit design obeys these additional rules specifying positioning of each circuit element of this other set of circuit elements relative to other circuit elements of this other set of circuit elements. These additional rules were created specifically for this other set of circuit elements prior to the placing and routing of this other set of circuit elements. At least part of this other set of circuit elements is optimized. Thus, in such embodiments, a placed, routed, and optimized circuit design includes multiple sets of circuit elements, where each set of circuit elements in the placed, routed, and optimized circuit design obeys respective rules. A hierarchical relationship can exist between two such sets.

Other embodiments include a computer readable medium with computer readable instructions for circuit design, with computer instructions that perform the technology described herein; a circuit design generated with the technology described herein; and an electrical circuit with circuitry designed by the technology described herein.

BRIEF DESCRIPTION OF THE DRAWINGS

FIG. 18 shows the placement of relative placement cells in a circuit design containing keepouts.

DETAILED DESCRIPTION

Relative placement information generates a structure of the instances and controls the placement of the instances. The resulting annotated netlist is used for physical optimization, during which the placement, routing, and optimization tool preserves the structure.

Figure 1:
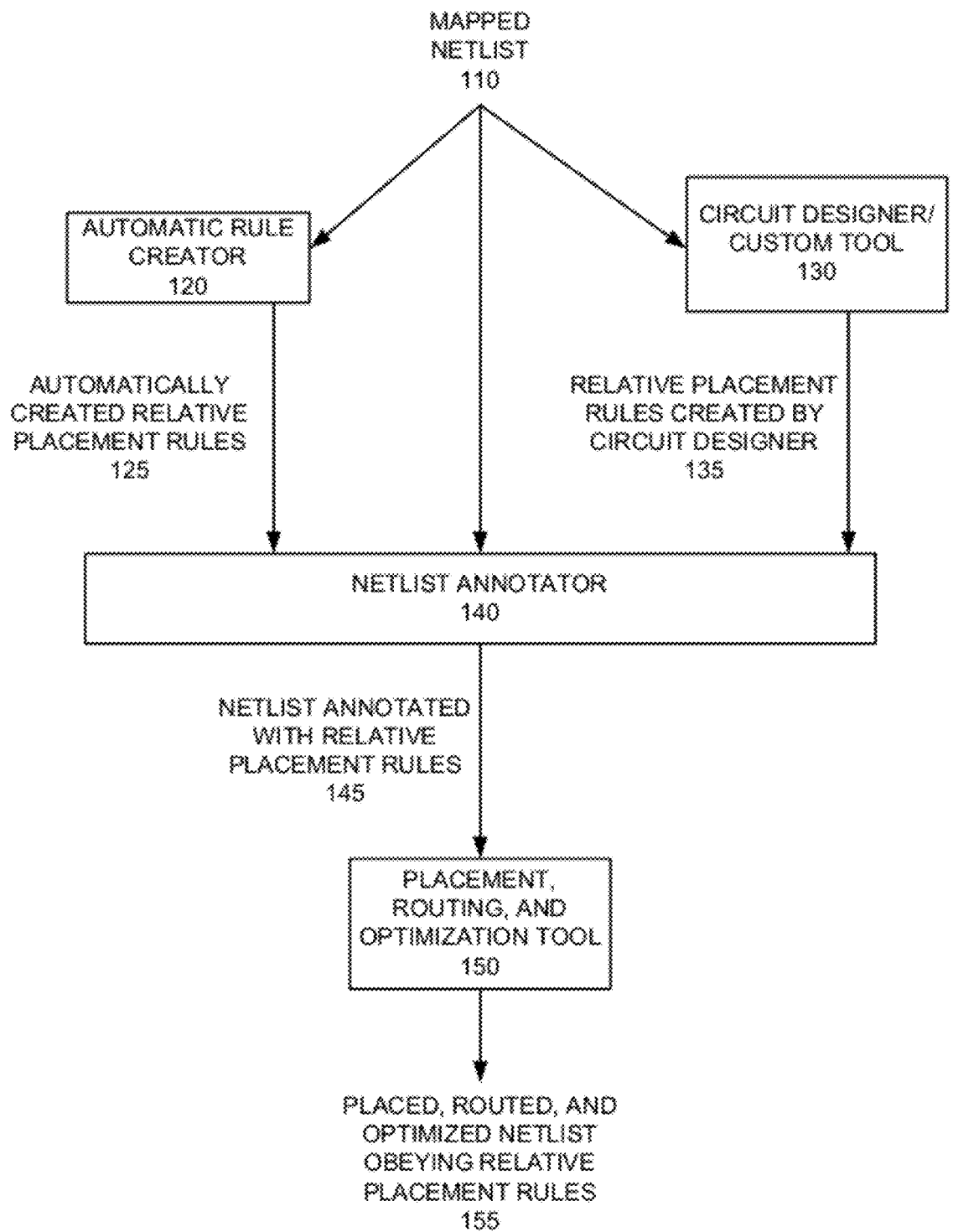
FIG. 1 is a flow diagram illustrating an exemplary process for using relative placement in circuit design.

FIG. 1 shows the overall flow for using relative placement. Relative placement usually is applied to datapaths and registers, but relative placement can be applied to any cells in a circuit design, controlling the exact relative placement topology of gate-level logic groups and defining the circuit layout.

At 110, a mapped netlist (a structural interconnection of library cells) is read. At 140, a netlist annotator adds annotations of the relative placement constraints to the mapped netlist. The relative placement constraints may have come from an automatic rule creator 120, which generates automatically created relative placement rules 125. Also, the relative placement constraints may have come from the circuit designer/custom tool 130, which generates relative placement rules created by the circuit designer 135. Based on the mapped netlist 110 and the relative placement rules, the netlist annotator 140 generates a netlist annotated with relative placement rules 145.

The netlist annotator 140, which may be GUI-based or text-based provides a way create relative placement structures for the placement, routing, and optimization tool 150. In a GUI-based annotator, the relative placement can be specified by drag-and-drop of circuit elements into positions relative to other circuit elements. Clicking multiple circuit elements and assigning an identifier such as a color, a pattern, or a name can define multiple groups with respective relative placement rules. With a text-based annotator, relative column and row positions can be specified of instances with respect to each other. These placement constraints create relative placement structures that are preserved during placement and legalization. Whether GUI-based or text-based, the cells in each structure group are placed as a single entity.

The placement, routing, and optimization tool 150 receives the netlist annotated with relative placement rules 145 and generates the placed, routed, and optimized netlist obeying relative placement rules 155.

Figure 2:
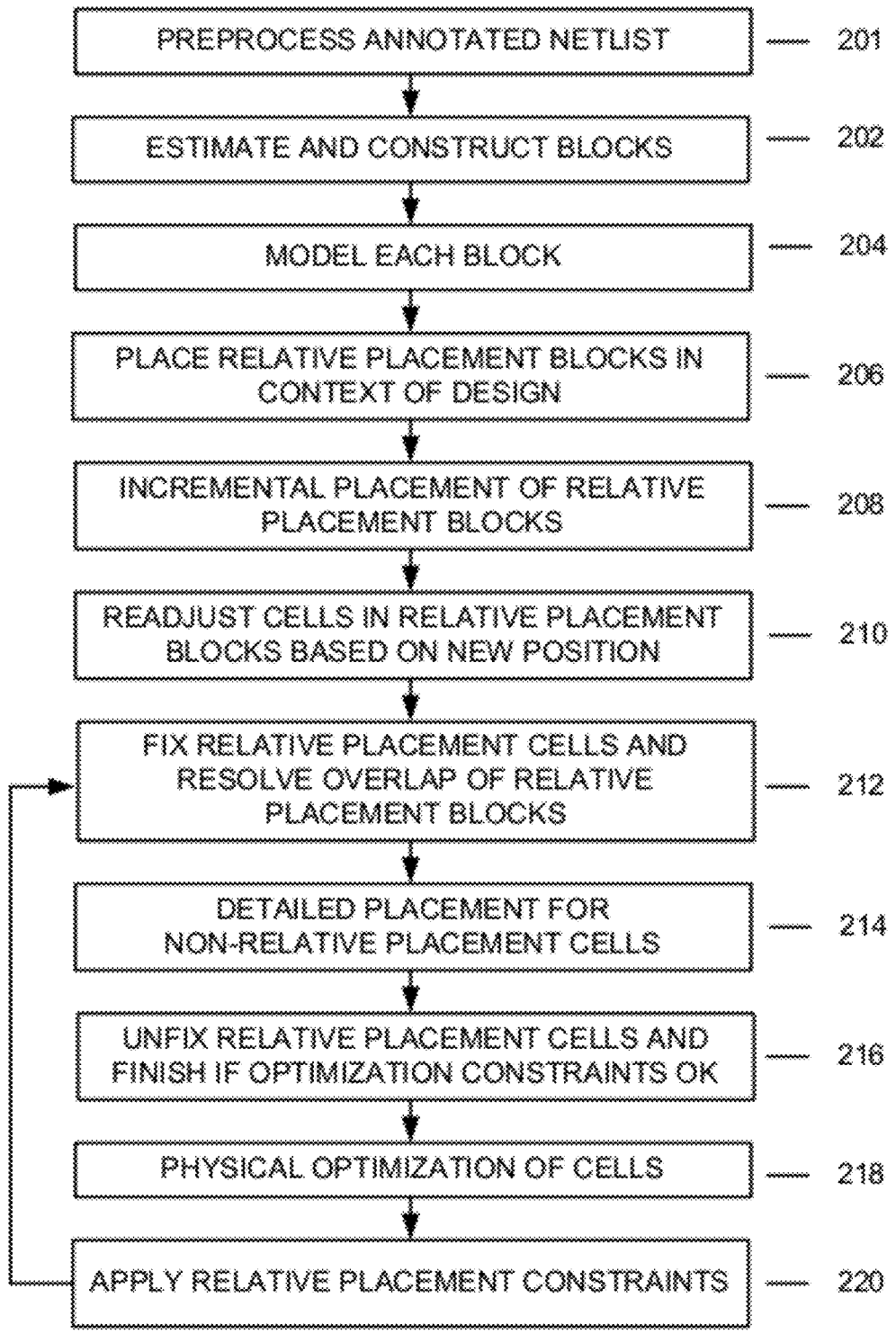
FIG. 2 is a flow diagram illustrating an exemplary process of the placement, routing, and optimization tool.

FIG. 2 shows an exemplary process flow of a placement, routing, and optimization tool. At 201, an annotated netlist is preprocessed for the relative placement annotation. Data structures are created to carry relative placement information. At 202, the sizes of relative placement blocks and aspect ratios are estimated by applying relative placement rules for each relative placement block. Any hierarchical relative placement blocks are estimated also. At 204, each of the estimated relative placement blocks is modeled for coarse placement purposes, for example as a macro with pin locations visible but the internal cells hidden from the coarse placer. At 206, the relative placement blocks are placed within the context of entire design, including the cells which have the relative placement rules simultaneously along with the cells which do not have relative placement rules. Among the relative placement blocks of cells, the blocks are placed one at a time. At 208, if needed another incremental placement is done for area recovery of sparse relative placement blocks. One block at a time is fixed based on the locations returned by the coarse placer. Individual relative placement instances are fixed before such area recovery. At 210, individual instances of cells are readjusted within each relative placement block, based on new locations determined by the placer according to the optimization constraints. User constraints are respected for each relative placement block. At 212, the nearest legal locations for all the relative placement cells are found, and the relative placement cells fixed there. Any overlaps of relative placement blocks are resolved by checking each of the already fixed blocks and making sure that the moved blocks do not overlap with them. If overlaps occurs, the moved blocks are moved with minimal movement as the cost. At 214, detailed placement is done for the non-relative placement cells, considering the fact that cells with relative placement are already fixed. At 216, all relative placement cells are unfixed. If optimization and relative placement constraints are met, then the tool can stop, finish writing out the placed and routed netlist, and exit the placement and optimization process. At 218, physical optimization is done for all the instances, including relative placement instances, to meet timing or any other user specified goals. This could focus on the most critical objectives such as timing, respecting design rules, congestion, wire length etc. At 220, relative placement constraints are reapplied, and locations readjusted based on optimization results. Thus, the relative placement constraints specified in the annotated netlist are preserved. The process then loops back to 212.

The above process can be rearranged, for example by combining, adding, removing, or modifying steps. For example, 212-216 can be rearranged, depending on the design, and 208 and 210 can be combined into one step.

Benefits of Relative Placement

Various embodiments that implement relative placement provide one or more of the following benefits:

1) Provides a method to maintain structured placement for legacy or intellectual property (IP) designs using a placement, routing, and optimization tool.

2) Handles flat and hierarchical designs.

3) For complex designs, a typical design can have many engineers working on it and many blocks. Hierarchical relative placement enables placing those blocks together relative to each other more easily. Any number of levels of hierarchies are allowed.

4) Reduces the placement search space in critical areas of the design resulting in greater predictability of QoR (wire length, timing, power) and congestion.

5) Is technology independent.

6) Improves routability.

Relative Placement Considerations

Various embodiments that implement relative placement require one or more of the following considerations:

1) When the placement, routing, and optimization tool estimates that the size of a relative placement block is not suitable to the given floorplan, the placement, routing, and optimization tool can fail in placement. To maintain relative placement information precisely, there should be enough space for relative placement blocks without overlapping placement obstructions in the design floorplan.

2) If the design contains multiheight cells and exact relative placement (perfect alignment of the cells on one or more sides of the row or column) is used, the current relative placement implementation might not get perfect alignment in every case.

3) There is no limit on the number of cells in a relative placement group. However, if the design has many relative placement groups, at times coarse placement returns overlapping group locations, resulting in misalignment. In these cases, a warning appears after coarse placement.

The following is a specific exemplary implementation of the discussed process flow. Many of the examples which follow are implemented with a text-based shell. The text-based examples are provided for in an exemplary Synopsys™ design environment for the purposes of illustration. The examples are also applicable to a GUI-based environment, in which the text-based commands are replaced or complemented with a mouse-driven interface.

Exemplary Relative Placement Flow

Implementing the methodology for the relative placement flow follows several steps.

1. In a design environment that permits a user to decide whether or not to use relative placement, relative placement is enabled. Relative placement is enabled by entering "XG mode", performed by entering the shell command: psyn_shell-xg-t>set physopt_enable_rp_in_xg_mode "true"

2. The gate-level netlist is prepared and read it in to the placement, routing, and optimization tool, using the read_milkyway or read_db command.

3. The relative placement data are prepared.

Create the relative placement groups. Use the create_rp_group command.

Add relative placement items to the groups. Use the add_to_rp_group command.

The netlist annotator annotates the netlist with the relative placement information, and generates a placed netlist containing the data.

4. Preserve the relative placement information in the annotated netlist. Use set_size_only to preserve relative placement information for cells that contain it. For example, enter
psyn_shell-xg-t>set_size_only {RP_cells} true 5. Set the block utilization of the relative placement block. The block utilization is how densely a block is packed. A value of 1 indicates no gap between columns. It could vary between 0 and less than or equal to 1. Enter
psyn_shell-xg-t>set physopt_use_block_utilization true
The default value is 1.0.

6. Read floorplan information. For example, enter
psyn_shell-xg-t>read_pdef top.pdef 7. Perform coarse placement for the design. Use the create_placement command.

8. Analyze the design using the placement, routing, and optimization tool GUI.

9. If the relative placement result is not acceptable, modify the relative placement file and run this procedure again.

If the relative placement is acceptable, then perform optimization, by running physopt.

Sample Script for a Relative Placement Flow

The following is a sample script for running a relative placement flow.

```
# Set library and design paths #
source setup.tcl
set physopt_enable_rp_in_xg_mode "true"
# Read db file generated from rp_reader #
```

```
read_db block_rp.db
read_db block2_rp.db
read_db other_blocks.db
read_db top.db
current_design top
link
link_physical_library
# Create relative placement #
create_rp_group
...
add_to_rp_group
...
# Apply constraints #
source constraints.tcl
# Apply set_size_only on relative placement cells to preserve relative placement information #
set_size_only {RP_cells} true
# Read floorplan information #
read_pdef top.pdef
# Perform coarse placement on the design #
create_placement
# Perform analysis. If okay, do physical synthesis or #
# incremental physical synthesis #
physopt or physopt -incremental
```

Considerations for Using Relative Placement

A design can contain both structured and unstructured items (leaf cells, keepouts, hierarchical groups). Control of which cells are to be structured is accomplished by including the cells to be structured in a relative placement group.

Determining which portions of the module need to be structured is beneficial. Providing relative placement information for cells that would have been placed better by allowing the placement, routing, and optimization tool to place the cells can produce poor results.

Some designs are appropriate for structured placement (for example, datapaths), whereas others are more appropriate for usual placement by the placement, routing, and optimization tool.

Data Required for Relative Placement

Relative placement requires a gate-level netlist. The format can be any format read by the placement, routing, and optimization tool.

Commands for Relative Placement

The basic functionality for relative placement is carried out by way of dedicated Tcl commands used within the placement, routing, and optimization tool. The commands create groups and add leaf cells, hierarchy, and keepouts to the groups. In addition, a script of annotated information can be generated, edited, and reapplied to the design, and relative placement groups can be removed.

In addition to these dedicated commands, physical synthesis commands are available.

Commands Specific to Relative Placement

Relative placement uses the dedicated commands listed in Table 1.

TABLE 1

| Dedicated Commands for Relative Placement | |
|---|---|
| Command | Described in section |
| create_rp_group | See "Creating Relative Placement Groups". |
| add_to_rp_group | See "Adding Items to a Group". |
| write_rp_group | See "Writing Relative Placement Information to a Script File". |
| remove_rp_group | See "Removing Relative Placement Information". |

Other Commands Often Used for Relative Placement

The commands listed in Table 2 are often used for relative placement.

TABLE 2

Other Commands Often Used for Relative Placement

| Command | Described in section |
|---|---|
| set_size_only | See "Preserving Relative Placement Information During Optimization". |
| create_bounds | See "Constraining Relative Placement Cell Placement Using Placement Bounds". |
| find | Locates and returns a collection of relative placement groups that match listed names. The man page has information. |
| source | Loads and runs a script file. The man page has information |

Preserving Relative Placement Information During Optimization

The relative placement information for an instance is attached to the instance. During optimization, relative placement cells can be optimized or removed. When an instance with relative placement information is removed during optimization, relative placement information attached to the instance is also removed.

To prevent relative placement cells from being removed during optimization, apply set_size_only to true on leaf cells to preserve relative placement information for cells that contain it. If relative placement cells are upsized or downsized, the relative placement cell alignment is maintained for placement.

Constraining Relative Placement Cell Placement Using Placement Bounds

The placement of relative placement cells is constrained by defining placement bounds. To do this, use the create_bounds command. Both soft bounds and hard bounds are supported for relative placement cells and both rectangular bounds and rectilinear bounds are supported.

Note: In relative placement, only move bounds (with fixed coordinates) are supported for relative placement cells. Group bounds are not supported. In other embodiments, group bounds are supported in relative placement.

Specify individual cell names as provided in an add_to_rp_group command with the create_bounds command. For example, enter psyn_shell-xg-t>create_bounds -coordinates {100 100 200 200} U1 U2 U3 U4

In other embodiments, a relative placement group is specified.

If some cells of a relative placement group are specified to be inside a bound and some cells are not specified to be inside the bound, cells that are not constrained by the bound are placed as loose cells. This can lead to legally correct but possibly poor placement QoR.

Ignoring Relative Placement Information

The tool can be directed to ignore relative placement information annotated to the design, for example, when to confirm that relative placement is helpful to QoR. To do this, set the variable physopt_ignore_structure to true (default is false).

Setting this variable to true causes the placement, routing, and optimization tool not to do structured placement for any relative placement groups in the design.

When the tool is directed to ignore relative placement information, the parts of the relative placement groups are placed as if the group has no relative placement information.

Removing Relative Placement Information

Relative placement annotation can be removed from an annotated database for one or more relative placement groups. To do this, use the remove_rp_group command.

Note: When a relative placement group is removed, the memory it occupies is freed to be reused by this same process. However, memory is not returned to the operating system until exit from psyn_shell.

To remove relative placement groups, enter
psyn_shell-xg-t>remove_rp_group [options]

| To do this | Use this |
|---|---|
| List the relative placement groups to remove. (vs. using -all). | group_list |
| Remove all relative placement groups. (vs. using -all). | -all |
| Remove all the designs within the hierarchies of the groups listed in the group list. By omitting this option, subgroups are not removed. (vs. using -all). | -hierarchy |
| During removal, disable printing the groups being removed. | -quiet |

Example

To remove the relative placement group named grp_ripple and confirm its removal, enter

```
psyn_shell-xg-t> find rp_group
{mul::grp_mul ripple::grp_ripple xample3::top_group}
psyn_shell-xg-t> remove_rp_group grp_ripple
Removing rp group 'ripple::grp_ripple'
1
psyn_shell-xg-t> find rp_group grp_ripple
Error: Can't find object 'grp_ripple'. (UID-109)
psyn_shell-xg-t> remove_rp_group -all
Removing rp group 'mul::grp_mul'
Removing rp group 'example3::top_group'
1
```

Modifying Relative Placement Information

A relative placement group can be modified. For example:
Remove items from a group
Rename a group
Move an item from one position to another
Realign or reorient items
A group can be modified in the following ways:
Remove the group to be changed, then create a new group that incorporates the changes.
Generate a script (using write_rp_group) and edit the information in the generated script.

Creating Relative Placement Groups

Figure 3:
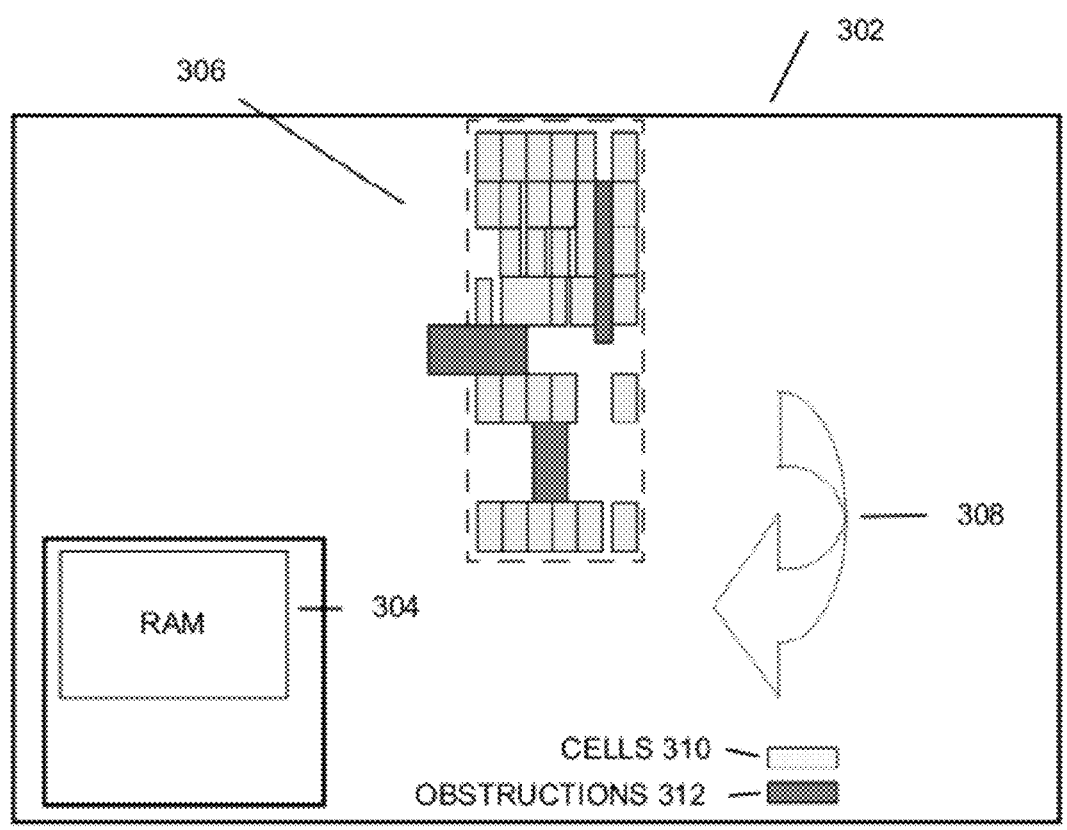
FIG. 3 shows the placement, as a single unit, of a group of circuit elements following relative placement rules.

A relative placement group is an association of cells, other groups, and keepouts. During placement and legalization, the group structure is preserved and the cells in the group are placed as a single entity. To create a group, use the create_rp_group command. The group is placed as a single entity, as shown in FIG. 3. In FIG. 3, floorplan 302 is shown. The group 306 includes cells 310 and obstructions 312. The group can be moved 308 as a single unit. The floorplan 302 also has RAM 304 which is fixed in place.

Positions for Columns and Rows in Relative Placement Data

Figure 4:
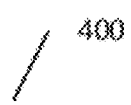
FIG. 4 shows circuit elements organized by relative placement rules into columns and rows.

FIG. 4 shows the positions for columns and rows in relative placement data 400. Columns count from column 0 (the leftmost column). Rows count from row 0 (the bottom row). The width of a column is the width of the widest cell in that column. The height of a row is determined by the height of the tallest cell in that row.

In FIG. 4, positions 0 3 (column 0, row 3) and 4 1 (column 4, row 1) are not used and therefore are not specified. Position 1 2 occupies (straddles) columns 1 and 2 in row 2. Position 4 3 in column 4 straddles rows 3 and 4.

Straddling is described in "Creating Relative Placement Structures Containing Multiple Column or Row Positions".

The following points can apply to creating a new group:
A new group is empty. To add leaf cells, hierarchy (other groups), and keepouts to the group, use the add_to_rp_group command.
Any number of groups can be created.
Relative placement groups are persistently stored using the write_milkyway command and read using the read_milkyway command.
The create_rp_group command returns a collection handle (identifier) to the relative placement groups that are created. If no objects were created, the empty string is returned.
To use the create_rp_group command, enter
psyn_shell-xg-t>create_rp_group [options]

| To do this | Use this |
|---|---|
| Name the group | group_name |
| Specify the name of the design in which to create the new group. Omitting this option, defaults the design to the current design. Using this switch is good practice. | -design |
| Specify the number of columns for the group, expressed as a positive integer. The default is 1. | -columns |
| Specify the number of rows for the group, expressed as a positive integer. The default is 1. | -rows |
| Specify the default pin name to look up on a cell. By specifying -pin_align_name in an add_to_rp_group command, the value specified in add_to_rp_group overrides the value specified here. See "Aligning Relative Placement by Pins". | -pin_align_name |
| Use the group for hierarchy instantiation. See "Defining Hierarchical Groups for Instantiation". | -instance |
| Anchor the group on the x-axis or the y-axis but allow the group to slide in the other dimension. The values are in microns and the offset is relative to the chip's origin. See "Anchoring Relative Placement Blocks at a Specified Location". | -x_offset or -y_offset |
| Anchor the group on both the x-axis and y-axis by specifying the lower-left coordinates (anchor) for the group. The values are in micron and the offset is relative to the chip's origin. See "Anchoring Relative Placement Blocks at a Specified Location". | -x_offset and -y_offset |

Example

To create the group named rp1 for designA having 1 column and 3 rows, enter
psyn_shell-xg-t>create_rp_group rp1 -design designA -columns 1 -rows 3

Renaming a Group

A group cannot be renamed directly. To rename a group, remove the group and create a new group that duplicates the removed group but has the new name. Alternatively, generate a script (using write_rp_group) and edit the name in the generated script. In other embodiments, the group can be renamed directly.

Adding Items to a Group

To add leaf cells, hierarchy groups, and keepouts to relative placement groups (created using create_rp_group), use the add_to_rp_group command.

When adding an item to a relative placement group, the following points can apply:
The relative placement group in which the item is added must exist. In another embodiment, a default group is created.
Switches identify whether the item added is a leaf cell (-leaf), hierarchical group (-hierarchy), or a keepout (-keepout).
The syntaxes for adding leaf cells, hierarchy groups, and keepouts differ. Table 3 provides a quick look up of the options allowed for each syntax.
If an item already exists in the group at the given column and row location or if the item to be inserted is already positioned, an error message appears.
The command returns a collection handle (identifier) to the relative placement groups in which the objects are added. If no objects are created, the empty string is returned.

Syntax for Adding a Leaf Cell

The syntax to add a leaf cell is
add_to_rp_group group_list -leaf cell_name
[-column col_number] [-row row_number]
[-pin_align_name pin_name]
[-orientation direction]

Syntax for Adding a Hierarchical Group

The syntax to add a hierarchical group is
add_to_rp_group group_list -hierarchy group_name
[-instance instance_name]
[-column col_number] [-row row_number]

Syntax for Adding a Keepout

The syntax to add a keepout is
add_to_rp_group group_list -keepout keepout_name
[-column column_number] [-row row_number]
[-width value] [-height value]

Options To Use to Add Items to Relative Placement Groups

Use appropriate options as shown previously in the syntaxes to add items to a relative placement group. The options used depend on the item to be added to the group. Table 3 provides a quick look up for the options available for each add_to_rp_group syntax.

| To do this | Use this |
|---|---|
| List the relative placement group names in which to add items. The groups must be for the same design. In other embodiments, different designs are permitted. | group_list |

-continued

| To do this | Use this |
|---|---|
| Specify the column position in which to add the item (default is 0). Column positions start at 0, which is the leftmost column. | -column |
| Specify the row position in which to add the item (default is 0). Row positions start at 0, which is the bottom row. | -row |
| Add the named leaf cell. Each leaf cell added must exist in the gate-level netlist. (vs. -hierarchy or -keepout for the position specified). In other embodiments, a default cell is created. | -leaf |
| Add the named relative placement group for hierarchy inclusion. The group can be used one time in another group in the same design. See "Defining Hierarchical Groups for Inclusion". (vs. -leaf or -keepout for the position specified). | -hierarchy |
| Specify the name of the instance on which to instantiate the given hierarchical relative placement group for hierarchy instantiation. A group can be instantiated more than once. See "Defining Hierarchical Groups for Instantiation". Use -instance with -hierarchy. (vs. -leaf or -keepout for the position specified). | -hierarchy -instance |
| Add the named hard keepout. There is no keepout object so the name provided here is to reference the keepout after it is created. See "Adding Keepouts". | -keepout |
| Specify the name of the pin to use for pin alignment of this cell with other cells in a group. If using -pin_align_name, the value specified here overrides a pin name provided with create_rp_group for the relative placement group to which it is being added. See "Aligning Relative Placement by Pins". | -pin_align_name |
| Specify the placement orientation of a cell with respect to the group to which it is added. PDEF or DEF syntax can be used, as follows:<br>PDEF orientations: 0, 90, 180, 270, 0-mirror, 90-mirror, 180-mirror, or 270-mirror<br>DEF orientations: N, W, S, E, FN, FW, FS, or FE<br>See "Specifying Orientation for Leaf Cells". | -orientation |
| Specify the width of the keepout to add. If -width omitted, the keepout defaults to the width of the widest cell in the column in which the keepout is added. Use this option with -keepout and -height. See "Adding Keepouts". | -width |
| Specify the height of the keepout to add. If -height omitted, the keepout defaults to the height of the tallest cell in the column in which the keepout is added. Use this option with -keepout and -width. See "Adding Keepouts". | -height |

Quick Lookup of Options for add_to_rp_group Syntaxes

Table 3 provides a quick lookup of the options available for the add_to_rp_group syntaxes.

TABLE 3

Quick Lookup of Options for add_to_rp_group Syntaxes

| Option | Syntax | Leaf cell | Hierarchy for Inclusion | Hierarchy for instantiation | Keepout |
|---|---|---|---|---|---|
| group_list | | X | X | X | X |
| -column | | X | X | X | X |
| -row | | X | X | X | X |
| -leaf | | X | | | |
| -hierarchy | | | X | X | |
| -keepout | | | | | X |
| -pin_align_name | | X | | | |
| -orientation | | X | | | |
| -instance | | | | X | |
| -width | | | | | X |
| -height | | | | | X |

Example

To find relative placement group grp_ripple, add leaf cell U2 to grp_ripple, then instantiate grp_ripple in the top group, enter

```
psyn_shell-xg-t> find rp_group grp_ripple
{ripple::grp_ripple}
psyn_shell-xg-t> add_to_rp_group grp_ripple -leaf carry_in_1
{ripple::grp_ripple}
psyn_shell-xg-t> add_to_rp_group top_group -hierarchy grp_ripple
-instance U2
{example3::top_group}
```

Adding Hierarchical Groups

Hierarchical relative placement allows relative placement groups to be embedded within other relative placement groups. The embedded groups then are handled similarly to leaf cells. To add hierarchical groups, use the add_to_rp_group command with its -hierarchy or -hierarchy and -instance switches, depending on the type of hierarchical group wanted.

Hierarchical relative placement simplified expression of relative placement constraints. With hierarchical relative placement, providing relative placement information multiple times is unnecessary for a recurring pattern.

Benefits of Using Hierarchical Groups in Relative Placement

Various embodiments that implement hierarchical relative placement provide one or more of the following benefits:

1) Allows organization of relative placement in a manner that is easier to maintain and understand. For example, the relative placement group can bed created to parallel Verilog or VHDL organization.

2) Allows reuse of a repeating placement pattern, for example, an adder.

3) Can reduce the number of lines of relative placement information to be written.

4) Allows integrating blocks.

5) Provides flexibility for the wanted configuration.

Types of Hierarchical Relative Placement Group Usage

Hierarchical relative placement in different ways, depending on whether the relative placement group is used in the same design or in different designs:

Inclusion

Applies to a relative placement group in the same design as the group in which it is included. An included group is used one time in the same design.

See "Defining Hierarchical Groups for Inclusion".

Instantiation

Applies to a relative placement group that is not from the design in which it is instantiated. An instantiated relative placement group can be used multiple times and in multiple places up to the number of times the design of the group is instantiated in the netlist.

See "Defining Hierarchical Groups for Instantiation".

Important:

The syntaxes for creating the hierarchical group definitions for inclusion and for instantiation are the same except the use of -instance switch for instantiation.

Defining Hierarchical Groups for Inclusion

To specify that a group is a hierarchically included group, specify hierarchy by using the -hierarchy switch with the add_to_rp_group command.

When a group is included in a parent group, it is as if the group is directly embedded within the parent group. An included group can be used in another group of the same design one time. However, the new group that contains the included group can be further included in another group in the same design or instantiated in another group of a different design.

See the syntax provided in "Syntax for Adding a Hierarchical Group" and the options summary provided in Table 3.

Example

To include the relative placement group named rp3 as a hierarchical group for inclusion in group rp4, enter psyn_shell-xg-t>add_to_rp_group rp4 -hierarchy rp3 -column 0 -row 0

The script in the following example defines the input for a hierarchical relative placement definition for inclusion. Groups rp1, rp2, rp3, and rp4 are all defined as being part of design top (shown in bold). The contents of groups rp1, rp2, and rp3 are treated as leaf cells when they are included in group rp4.

Example Hierarchical Relative Placement Definition for Inclusion

```
create_rp_group rp1 -design top -columns 2 -rows 1
   add_to_rp_group rp1 -leaf U1 -column 0 -row 0
   add_to_rp_group rp1 -leaf U4 -column 1 -row 0
create_rp_group rp2 -design top -columns 2 -rows 1
   add_to_rp_group rp2 -leaf U2 -column 0 -row 0
   add_to_rp_group rp2 -leaf U5 -column 1 -row 0
create_rp_group rp3 -design top -columns 2 -rows 1
   add_to_rp_group rp3 -leaf U3 -column 0 -row 0
   add_to_rp_group rp3 -leaf U6 -column 1 -row 0
create_rp_group rp4 -design top -columns 1 -rows 3
   add_to_rp_group rp4 -hier rp1 -column 0 -row 0
   add_to_rp_group rp4 -hier rp2 -column 0 -row 1
   add_to_rp_group rp4 -hier rp3 -column 0 -row 2
```

In the above example,

Groups rp1, rp2, and rp3 are each defined as having two columns and one row.

Group rp4, in which groups rp1, rp2, and rp3 are included (each group used one time), is defined as having one column and three rows.

Each included group is defined as a hierarchical subgroup (group rp1 as subgroup rp1, group rp2 as subgroup rp2 and group rp3 as subgroup rp3).

Group rp4 can be further included as a hierarchical subgroup in another group in the same design.

Figure 5:
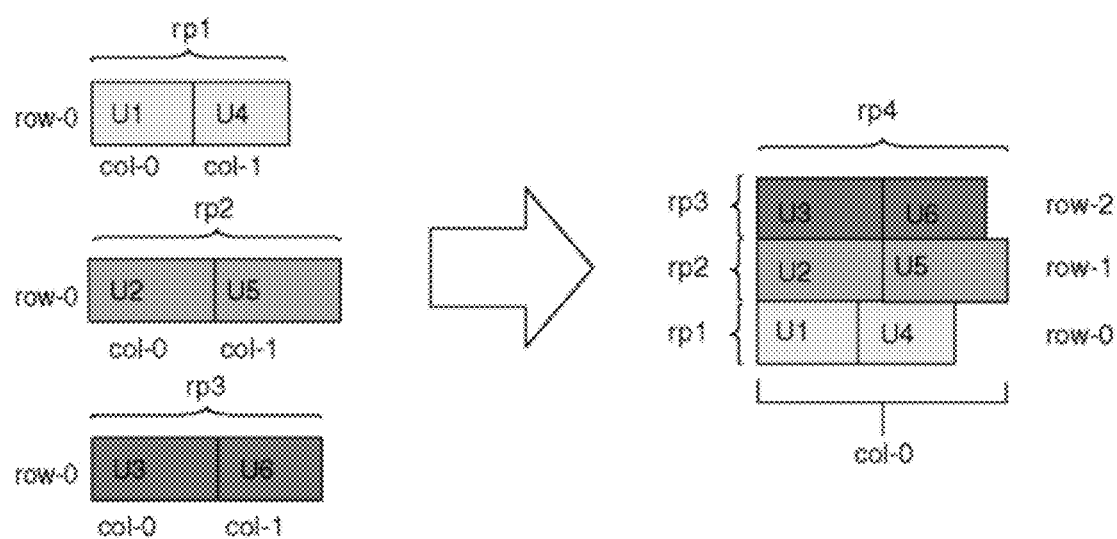
FIG. 5 shows the creation of a hierarchy of circuit elements organized by relative placement rules.

The construction of the resulting hierarchical relative placement structure is shown in FIG. 5.

Groups rp1, rp2, and rp3 are from the same design, top_design. They are included in group rp4, which can be further included one time in top design.

Defining Hierarchical Groups for Instantiation

Specify that a group is a hierarchically instantiated group by specifying hierarchy plus an instance name with the add_to_rp_group command.

Instantiating a group is a useful way to replicate relative placement information across multiple instances of a design and to create relative placement relationships between those instances. An instantiated group can be used multiple times and in multiple places. For example, various embodiments use hierarchy instantiation for one or more of these cases:

1) Multiple relative placement layouts are to be used for different instances of a design.

2) Despite one layout, relative placement is to be specified between instances of that layout or between instances and other cells and groups.

The syntax for instantiation is the same as the syntax for inclusion but provides the -instance switch in addition to the -hierarchy switch. The -instance switch specifies the hierarchical cell upon which to instantiate the given hierarchical relative placement group. The instance is within the design of the group to which it is added and is an instance of the same design of the group being added hierarchically.

When uniquified, instantiated groups are dropped unless they are required for the newly uniquified group; that is, each instantiation will go to one uniquified design.

See the syntax provided in "Syntax for Adding a Hierarchical Group" and the options summary provided in Table 3.

Example

To instantiate the relative placement group named rp1 using a hierarchical cell instance named I1 in the relative placement group named rp2, enter

```
psyn_shell-xg-t> add_to_rp_group rp2 -hierarchy rp1
   -instance I1 -column 0 -row 0
```

The script in the example below provides a definition for hierarchical relative placement for instantiation. Group rp1 is in the design pair_design (shown in bold) and defines leaf cells U1 and U2 as the group. Group rp2 is in the design mid_design (shown in bold) and instantiates three instances of group rp1 from pair_design, named I1, I2, and I3. Each instance is defined as a subgroup plus an instance name and each is treated as a leaf cell.

Example Definition for Hierarchical Relative Placement for Instantiation

```
create_rp_group rp1 -design pair_design -columns 2 -rows 1
   add_to_rp_group rp1 -leaf U1 -column 0 -row 0
   add_to_rp_group rp1 -leaf U2 -column 1 -row 0
create_rp_group rp2 -design mid_design -columns 1 -rows 3
   add_to_rp_group rp2 -hier rp1 -instance I1 -column 0 -row 0
   add_to_rp_group rp2 -hier rp1 -instance I2 -column 0 -row 1
   add_to_rp_group rp2 -hier rp1 -instance I3 -column 0 -row 2
```

In the above example,

Instances I1, I2, and I3 are hierarchical cells instantiating the design pair_design.

Groups rp1 is defined as having two columns and one row and contains leaf cells U1 and U2.

Group rp2, in which group rp1 is instantiated three times, is defined as having one column and three rows. Each instantiated group is defined as a hierarchical subgroup containing a named instance.

Group rp2 is treated as a leaf cell, and can be used multiple times if it is further instantiated.

Figure 6:
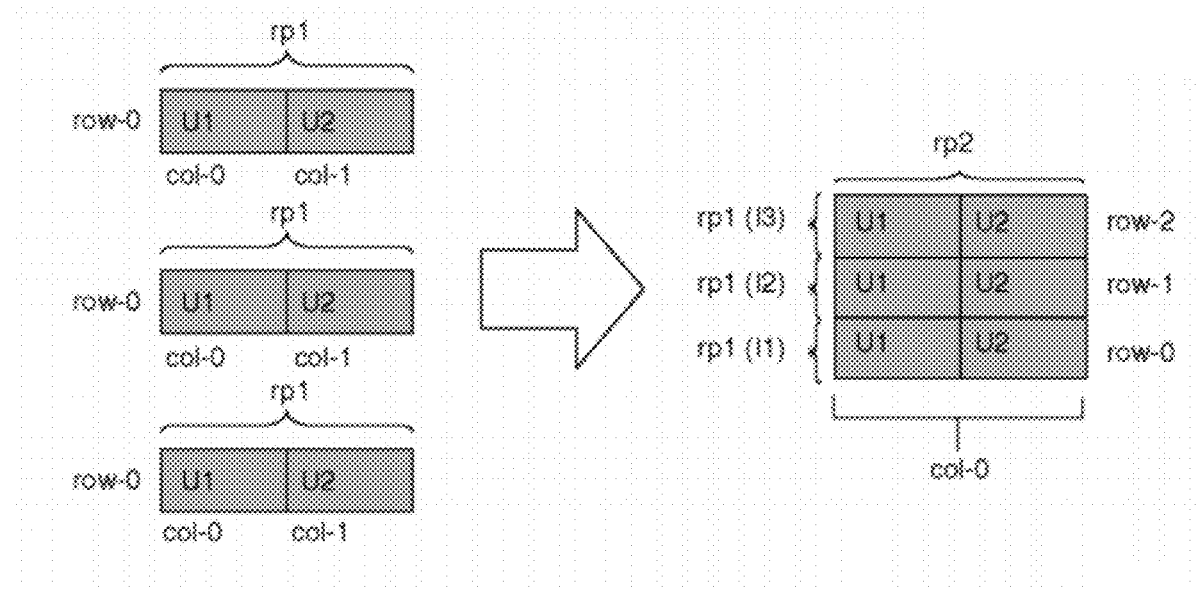
FIG. 6 shows the creation of a multiple instances of circuit elements hierarchically organized by relative placement rules.

The construction of the resulting hierarchical relative placement block is shown in FIG. 6.

Group rp1 belongs to the design pair_design. It is instantiated three times in group rp2, which can be further instantiated in different designs.

Ungrouping Hierarchical Relative Placement

The ungroup command changes hierarchical relative placement structure.

After using ungroup, hierarchical relative placement instantiation is converted to hierarchical relative placement inclusion because the design is flattened and all the groups are now of the same design. Instantiation of hierarchical modules no longer exists.

Relative placement groups affected by an ungroup command are renamed to show the path to the group before flattening followed by a slash (/) and the original group name. If this results in a name collision, a numbered suffix is added to create a unique name. For example, rp2 rp1(I3) 0 2 becomes rp2 I3/rp1 0 2 after ungrouping.

Figure 7:
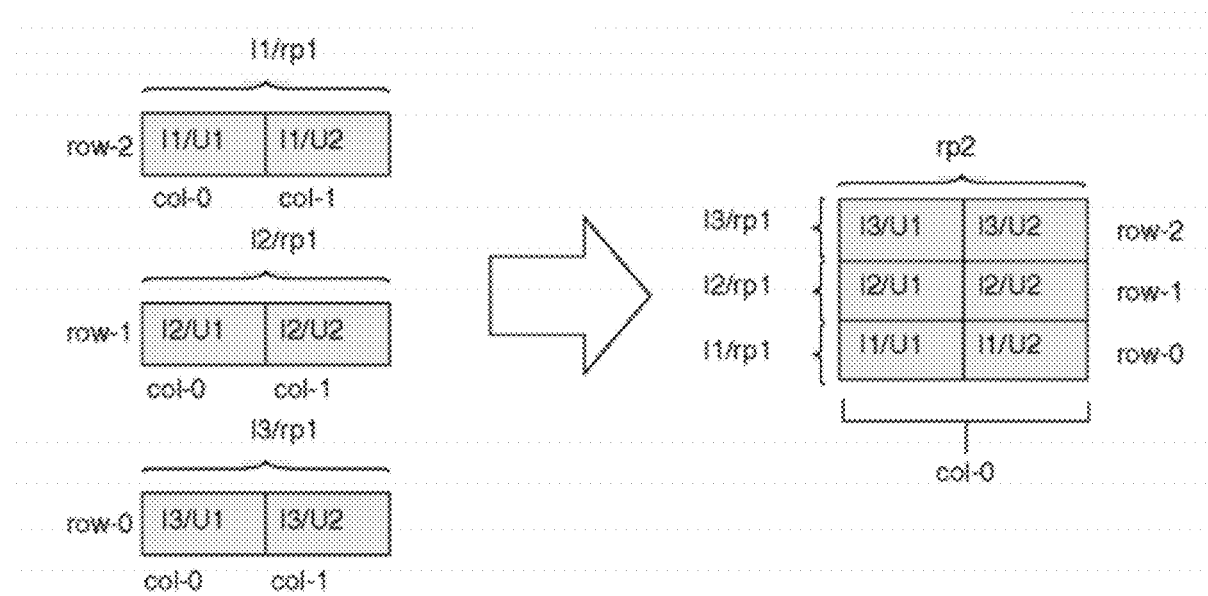
FIG. 7 shows an ungrouped version of the circuit design of FIG. 6.

Using the hierarchical block shown in FIG. 6, the relative placement definition is now as shown in the example below. After ungroup -flatten -all, the resulting ungrouped hierarchical placement block is as shown in FIG. 7.

Example Hierarchical Relative Placement Changed by the Ungroup Command

```
create_rp_group I1/rp1 -design mid_design -columns 2 -rows 1
    I1/rp1 -leaf I1/U1 -column 0 -row 0
    I1/rp1 -leaf I1/U2 -column 1 -row 0
create_rp_group I2/rp1 -design mid_design -columns 2 -rows 1
    I2/rp1 -leaf I2/U1 -column 0 -row 0
    I2/rp1 -leaf I2/U2 -column 1 -row 0
create_rp_group I3/rp1 -design mid_design -columns 2 -rows 1
    I3/rp1 -leaf I3/U1 -column 0 -row 0
    I3/rp1 -leaf I3/U2 -column 1 -row 0
create_rp_group rp2 -design mid_design -columns 1 -rows 3
    rp2 -hierarchy I1/rp1 -column 0 -row 0
    rp2 -hierarchy I2/rp1 -column 0 -row 1
    rp2 -hierarchy I3/rp1 -column 0 -row 2
```

Uniquifying Hierarchical Relative Placement

The uniquify command can change each instantiation of hierarchical relative placement structure.

For example, uniquifying

```
group grp_top top 1 2
    hier grp_ripple(U1) 0 0
    hier grp_ripple(U2) 0 1
group grp_ripple ripple
    [ ... ]
results in
group grp_top top 1 2
    hier grp_ripple_1(U1) 0 0
    hier grp_ripple_2(U2) 0 1
group grp_ripple_1 ripple_1
group grp_ripple_2 ripple_2
```

Adding Keepouts

Hard keepouts can be specified within relative placement blocks. To do this, use the add_to_rp_group command with its -keepout switch.

When defining keepouts, the one or more of the following points can apply:

Keepouts are not objects. A name is to be provided for reference. IN other embodiments, object keepouts are created.

The width and height of a keepout can be specified.

The unit of width for a keepout is the number of placement sites. If the width is not specified, the default width is the width of the widest cell in that column.

The unit of height for a keepout is one row. If the height is not specified, the default height is the height of the tallest cell in that row.

See the syntax provided in "Syntax for Adding a Keepout" and the options summary provided in Table 3.

Example

Figure 8:
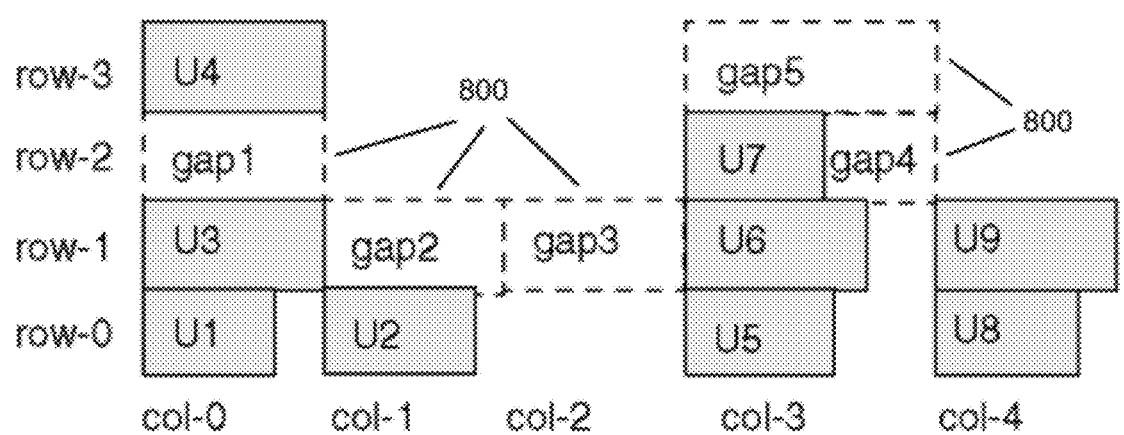
FIG. 8 shows a circuit design with keepouts defined by the relative placement rules.

To create the hard keepout named gap1 shown in FIG. 8, enter

```
psyn_shell-xg-t> add_to_rp_group misc
    -keepout gap1
    -column 0 -row 2
    -width 15 -height 1
```

FIG. 8 shows a relative placement block containing keepouts 800 (named gap1 . . . gap5 in this example). The input to define the keepouts 800 is provided in the example below, following the figure.

The script in the example below provides the definition for the relative placement block containing keepouts shown in FIG. 8.

Example Definition for Relative Placement Input for Defining Keepouts

```
create_rp_group misc -design top -columns 5 -rows 4
    add_to_rp_group misc -leaf U1 -column 0 -row 0
    add_to_rp_group misc -leaf U3 -column 0 -row 1
    add_to_rp_group misc -keepout gap1 -column 0 -row 2 -width 15
        -height 1
    add_to_rp_group misc -leaf U4 -column 0 -row 3
    add_to_rp_group misc -leaf U2 -column 1 -row 0
    add_to_rp_group misc -keepout gap2 -column 1 -row 1 -width 15
        -height 1
    add_to_rp_group misc -keepout gap3 -column 2 -row 1 -width 10
        -height 1
    add_to_rp_group misc -leaf U5 -column 3 -row 0
    add_to_rp_group misc -leaf U6 -column 3 -row 1
    add_to_rp_group misc -leaf U7 -column 3 -row 2
    add_to_rp_group misc -keepout gap4 -column 3 -row 2 -width 5
        -height 1
    add_to_rp_group misc -keepout gap5 -column 3 -row 3 -width 20
        -height 1
    add_to_rp_group misc -leaf U8 -column 4 -row 0
    add_to_rp_group misc -leaf U9 -column 4 -row 1
```

Creating Relative Placement Structures Containing Multiple Column or Row Positions A cell can occupy multiple column positions or multiple row positions, which is known as straddling. To define straddling, use the inclusion hierarchical relative placement syntax (see "Defining Hierarchical Groups for Inclusion"). When a group is an included group, it can be used once in the design in which it is defined. However, the new group in which it is included can be included or instantiated in another group.

Figure 9:
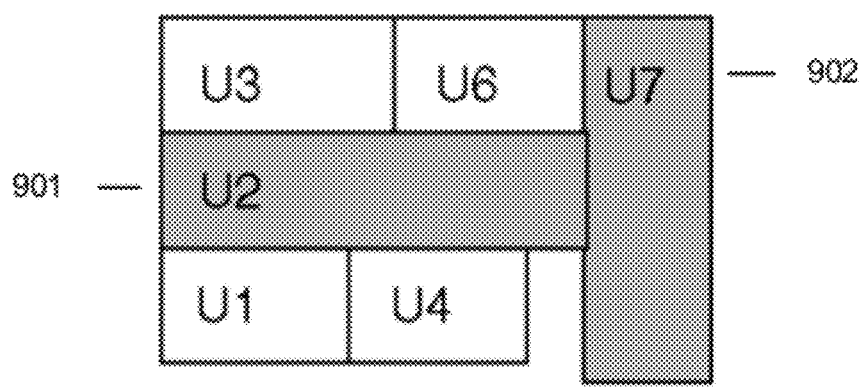
FIG. 9 shows cells that straddle multiple columns and multiple rows as defined by the relative placement rules.

FIG. 9 shows a relative placement group in which cells straddle columns (instance U2 901) and rows (instance U7 902).

The script in the example below provides the definition for the relative placement block shown in FIG. 9.

To construct the hierarchy needed for straddling, the leaf cell groups are defined for rp1, rp2 (the cell that straddles columns 0 and 1), and rp3, then define group rp4 to contain groups rp1, rp2, and rp3. Finally, rp5 is defined to contain group rp4 and leaf cell U7 (the cell that straddles rows 0, 1, and 2).

Example Definition for Relative Placement Input for Hierarchical Placement with Straddling

```
create_rp_group rp1 -design top -columns 2 -rows 1
    add_to_rp_group rp1 -leaf U1 -column 0 -row 0
    add_to_rp_group rp1 -leaf U4 -column 1 -row 0
create_rp_group rp2 -design top -columns 1 -rows 1
    add_to_rp_group rp2 -leaf U2 -column 0 -row 0
create_rp_group rp3 -design top -columns 2 -rows 1
    add_to_rp_group rp3 -leaf U3 -column 0 -row 0
    add_to_rp_group rp3 -leaf U6 -column 1 -row 0
create_rp_group rp4 -design top -columns 1 -rows 3
    add_to_rp_group rp4 -hier rp1 -column 0 -row 0
    add_to_rp_group rp4 -hier rp2 -column 0 -row 1
    add_to_rp_group rp4 -hier rp3 -column 0 -row 2
create_rp_group rp5 -design top -columns 2 -rows 1
    add_to_rp_group rp5 -hier rp4 -column 0 -row 0
    add_to_rp_group rp5 -leaf U7 -column 1 -row 0
```

Figure 10:
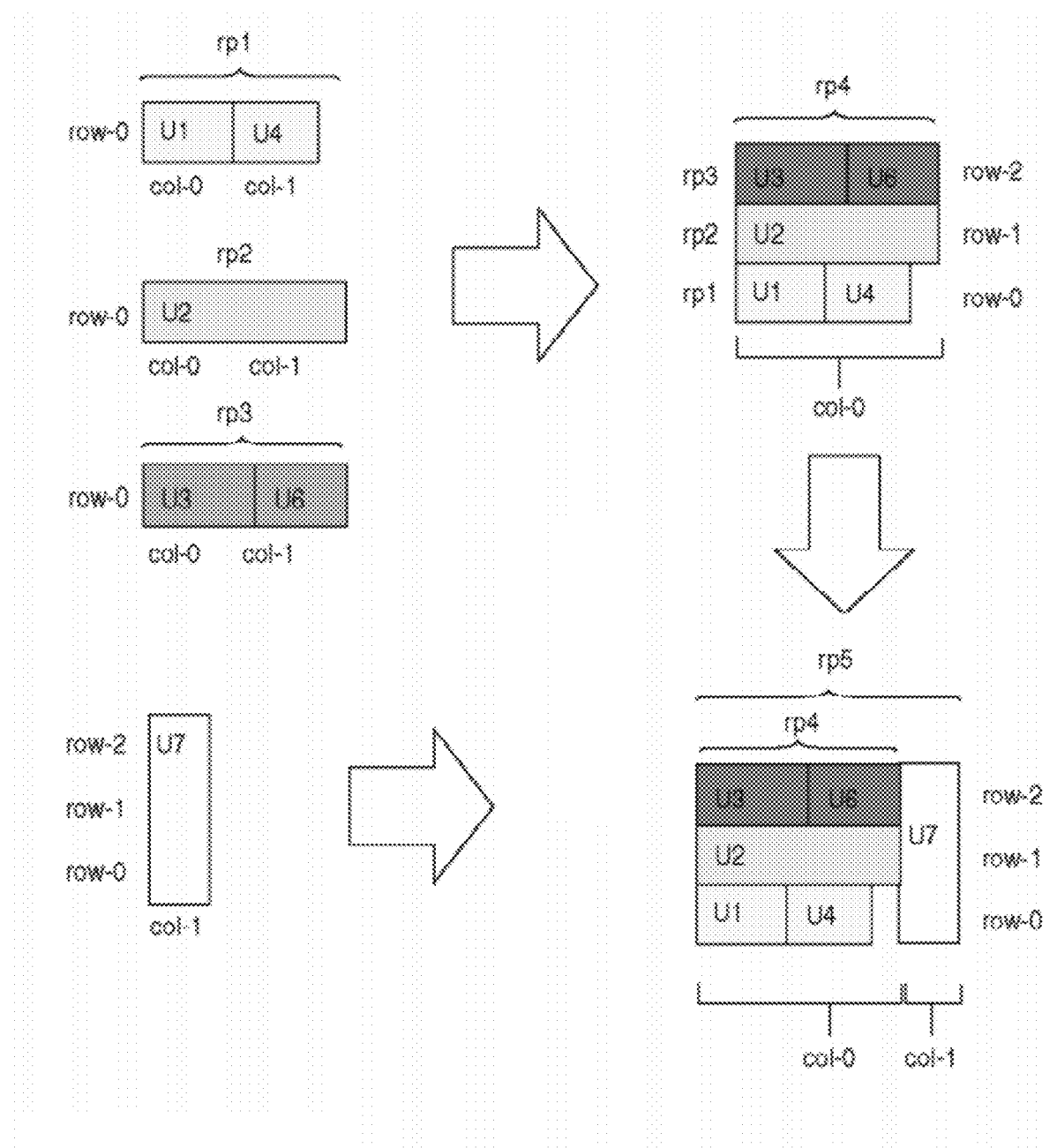
FIG. 10 shows the creation of a hierarchy of circuit elements organized by relative placement rules that permit straddling of multiple rows and multiple columns.

FIG. 10 shows the construction of the hierarchy defined in the example above.

Specifying Orientation for Leaf Cells

By default, the placement, routing, and optimization tool does orientation optimization (automatic orientation) for cells in relative placement groups but orientation can be specified for cells on a per-cell basis, use a mix of user-specified orientation and automatic orientation, or disable orientation on cells in relative placement groups. You cannot specify orientation for a group. In some embodiments, specifying orientation for a group specifies that orientation for all cells of the group.

If an orientation is not specified for a cell, by default, the tool uses either orientation optimization or the default orientation for the cell. Orientation optimization can flip a cell from its default orientation to improve wire length.

To specify orientation for leaf cells, use the add_to_rp_group command with its -orientation switch and the syntax for defining a leaf cell. In addition, direct the placement, routing, and optimization tool is to be directed regarding orientation optimization.

When specifying orientation, one or more of the following points can apply:

Orientation specified has precedence over orientation optimization and default orientation.
  If an orientation that is not valid is specified, that orientation is ignored and a valid orientation is used.
  Specifying both pin alignment and orientation in the same invocation might be contradictory. Although every attempt is made to honor such a request, honoring both might not be possible. In this case, the orientation specification takes precedence over the pin alignment specification.
  If orientation is not specified for a cell and automatic orientation is done, pin alignment is honored.

The syntax is

```
add_to_rp_group group_list -leaf instance_name
    -column col_number -row row_number -orientation direction
```

For syntax details, see "Adding Items to a Group".

Directing Orientation Optimization

Orientation optimization can flip a cell to improve relative placement wire length, thereby improving QoR for the design. Orientation optimization is enabled by default.

The physopt_rp_enable_orient_opt variable controls whether orientation optimization is enabled (default true). Orientation optimization is enabled or disabled according to whether to specify the orientation for some cells or disable orientation optimization.

Specifying a Mix of User-Specified Orientation and Automatic Orientation

Orientation can be specified for some cells in a group and automatic orientation allowed for the other cells. To do this, ensure that the physopt_rp_enable_orient_opt variable is set to true (the default).

This ensures that orientations specified are respected and automatic orientation is done for the other cells.

Disabling Orientation Optimization

Orientation optimization can be disabled by setting physopt_rp_enable_orient_opt to false (default is true), for example, when pin alignment is to have precedence.

When this variable is set to false, the specified orientation is respected if the orientation is valid. If no user-specified orientation exists, a default valid orientation is chosen.

Specifying Orientation and Pin Alignment

Both orientation and pin alignment can be specified in the same invocation but doing this might be contradictory.

When used with pin alignment, in various embodiments the priorities for orientation are as follows, in this order:

1. User-specified orientation

When used with pin alignment, orientation has precedence.

2. Orientation optimization

If orientation is not specified for a cell and orientation optimization is done, pin alignment is honored.

3. Default orientation

When used with pin alignment, pin alignment has precedence.

Other embodiments remove, add to, or rearrange the above priorities.

Figure 11:
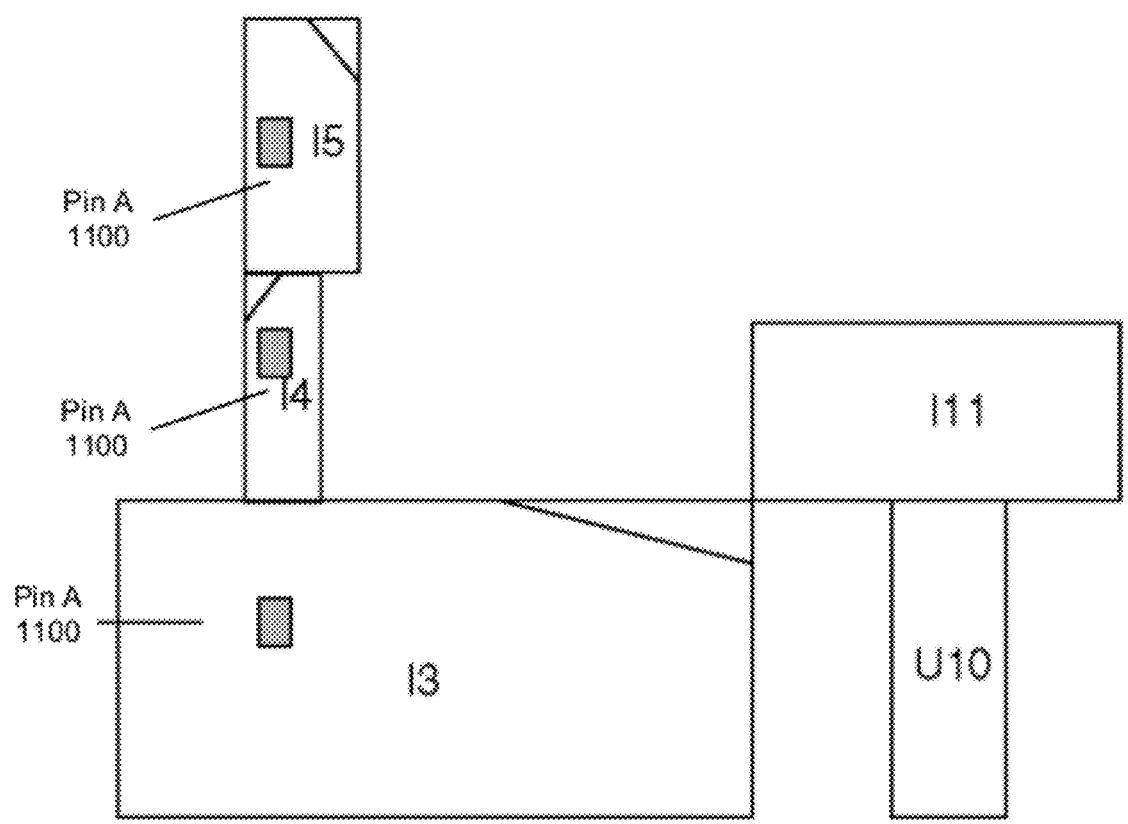
FIG. 11 shows a circuit design organized by relative placement rules with orientation optimization and pin alignment.

FIG. 11 shows orientation optimization used with pin alignment, in particular pin A 1100. In such a case, both orientation and pin alignment are honored. (Not all leaf cells listed in the example that follows the figure are shown in the figure.)

The example below provides the definition for the relative placement shown in FIG. 11.

Example Orientation Optimization Used with Pin Alignment

```
create_rp_group misc1 -design block1 -columns 3 -rows 10
-pin_alignment A
    add-to_rp_group misc1 -leaf I3 -column 0 -row 0 -orientation N
    add-to_rp_group misc1 -leaf I4 -column 0 -row 1 -orientation FN
    add-to_rp_group misc1 -leaf I5 -column 0 -row 2 -orientation N
    add-to_rp_group misc1 -leaf I6 -column 0 -row 3
    add-to_rp_group misc1 -leaf I7 -column 0 -row 4
    add-to_rp_group misc1 -leaf I8 -column 0 -row 5
```

Writing Relative Placement Information to a Script File

Specified relative placement groups can be written to a named file, creating a Tcl-format script for recreating relative placement groups and their items on the same design. To do this, use the write_rp_group command.

The command returns a collection handle (identifier) of relative placement groups written out. If no objects were written, the empty string is returned.

To use the write_rp_group_command, enter psyn_shell-xg-t>write_rp_group [options]

| To do this | Use this |
|---|---|
| List the groups to write to the script. (vs. using -all). | group_list |
| Write all the relative placement groups to the script. (vs. using a group list or -hierarchy). | -all |
| Write all the relative placement groups within the hierarchy of the relative placement groups. By omitting this option, subgroups are not written. | -hierarchy |
| Disable line splitting when information exceeds the column width. | -nosplit |
| Write the script to the specified file. By omitting this option, the information is written to the screen. | -output |

Example

To save all the relative placement groups to disk, remove the information from the design, then recreate the information on the design, enter

```
psyn_shell-xg-t> find rp_group
{mul::grp_mul ripple::grp_ripple example3::top_group}
psyn_shell-xg-t> write_rp_group -all -output my_groups.tcl
1
psyn_shell-xg-t> remove_rp_group -all -quiet
1
psyn_shell-xg-t> find rp_group
Error: Can't find objects matching '*'. (UID-109)
psyn_shell-xg-t> source my_groups.tcl
{example3::top_group}
psyn_shell-xg-t> find rp_group
{example3::top_group ripple::grp_ripple mul::grp_mul}
```

Aligning Relative Placement by Pins

Columns can be aligned by pins instead of by the lower-left corner (the default). This capability increases the probability of straight routes and can result in less congestion, lower power, and lower routing resources by eliminating vias.

To align a group by pins, use the create_rp_group command with its -pin_align_name switch.

When aligning by pins, one or more of the following points can apply:

When specifying a pin name, the tool determines the location for that pin in cells in the column, then aligns the column based on the pin locations.

If cells in a column do not have the pin specified, the column is aligned as follows:

If some cells in a column do not have the pins specified, those cells are aligned with a default position (e.g., the lower-left corner) and an information message appears.

If no cells in a column have the pins specified, the cells are aligned with a default position (e.g., the lower-left corner) and a warning appears.

Aligning by pins can result in empty space between columns.

Both pin alignment and orientation can be specified in the same invocation but doing this might be contradictory. Although every attempt is made to honor such a request, honoring both might not be possible. In this case, the orientation specification takes precedence over the pin alignment specification.

The widest cell in the column determines the width of the column.

Figure 12:
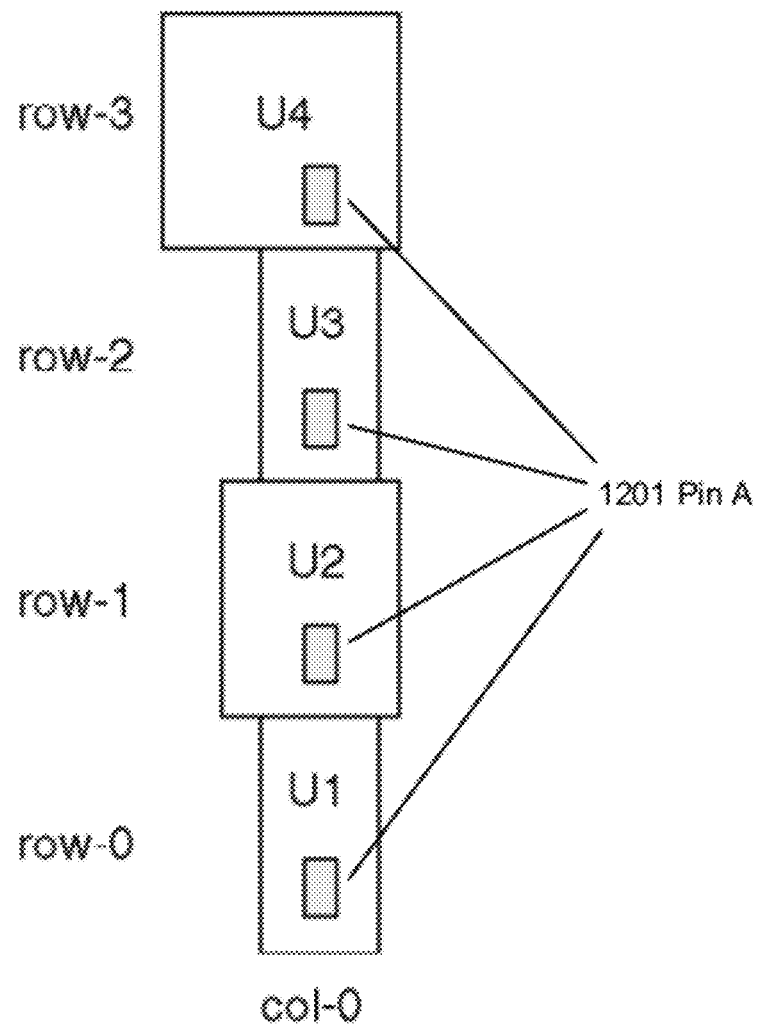
FIG. 12 shows a relative placement group of a circuit design aligned by pins.

FIG. 12 shows a relative placement group aligned by pins.

The script in the example below defines the relative placement group shown in FIG. 12, which is aligned by pin A 1201.

Example Definition for Relative Placement Group Aligned by Pins

```
create_rp_group rp1 -design pair_design -columns 1 -rows 4
    -pin_align_name A
    add_to_rp_group rp1 -leaf U1 -column 0 -row 0
    add_to_rp_group rp1 -leaf U2 -column 0 -row 1
    add_to_rp_group rp1 -leaf U3 -column 0 -row 2
    add_to_rp_group rp1 -leaf U4 -column 0 -row 3
```

Figure 13:
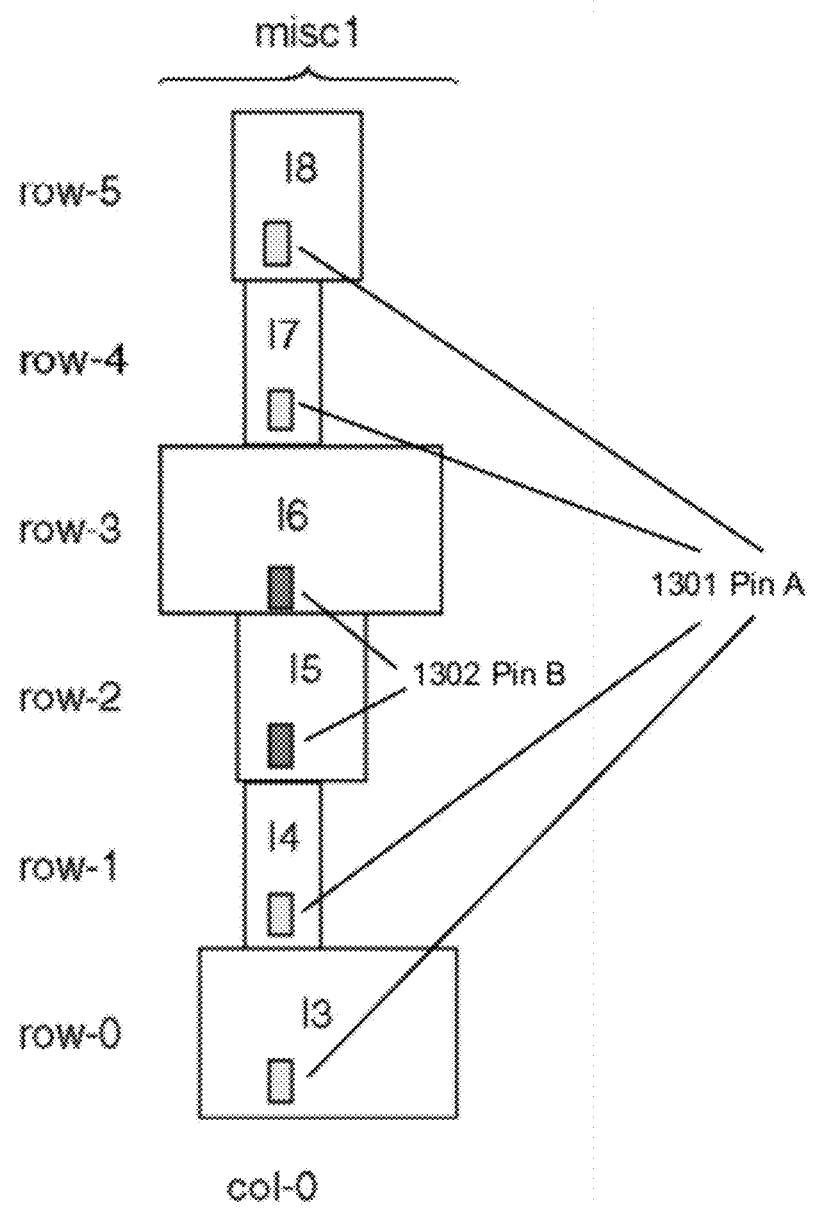
FIG. 13 shows a relative placement group of a circuit design aligned by multiple pins.

A column can be aligned within a placement group by a specified pin and align cells within the column by a different pin as shown in FIG. 13, with pin A 1301 and pin B 1302. The alignment pin name specified for particular cells in the column overrides the alignment pin name specified for the group.

A set of cells can be specified to align over specified pins. For example, pins A and B can be aligned in a group by specifying a different pin alignment name for some cells.

The script in the example below defines the relative placement group shown in FIG. 13. In the example, the group misc1 is aligned by pin A and instances I5 and I6 within the group are aligned by pin B, overriding the group pin alignment name A for those instances.

Example Definition to Align a Group and Leaf Cells by Pins

```
create_rp_group misc1 -design block1 -columns 3 -rows 10
    -pin_align_name A
    add_to_rp_group misc1 -leaf I3 -column 0 -row 0
    add_to_rp_group misc1 -leaf I4 -column 0 -row 1
    add_to_rp_group misc1 -leaf I5 -column 0 -row 2
    -pin_align_name B
    add_to_rp_group misc1 -leaf I6 -column 0 -row 3
    -pin_align_name B
    add_to_rp_group misc1 -leaf I7 -column 0 -row 4
    add_to_rp_group misc1 -leaf I8 -column 0 -row 5
```

Figure 14:
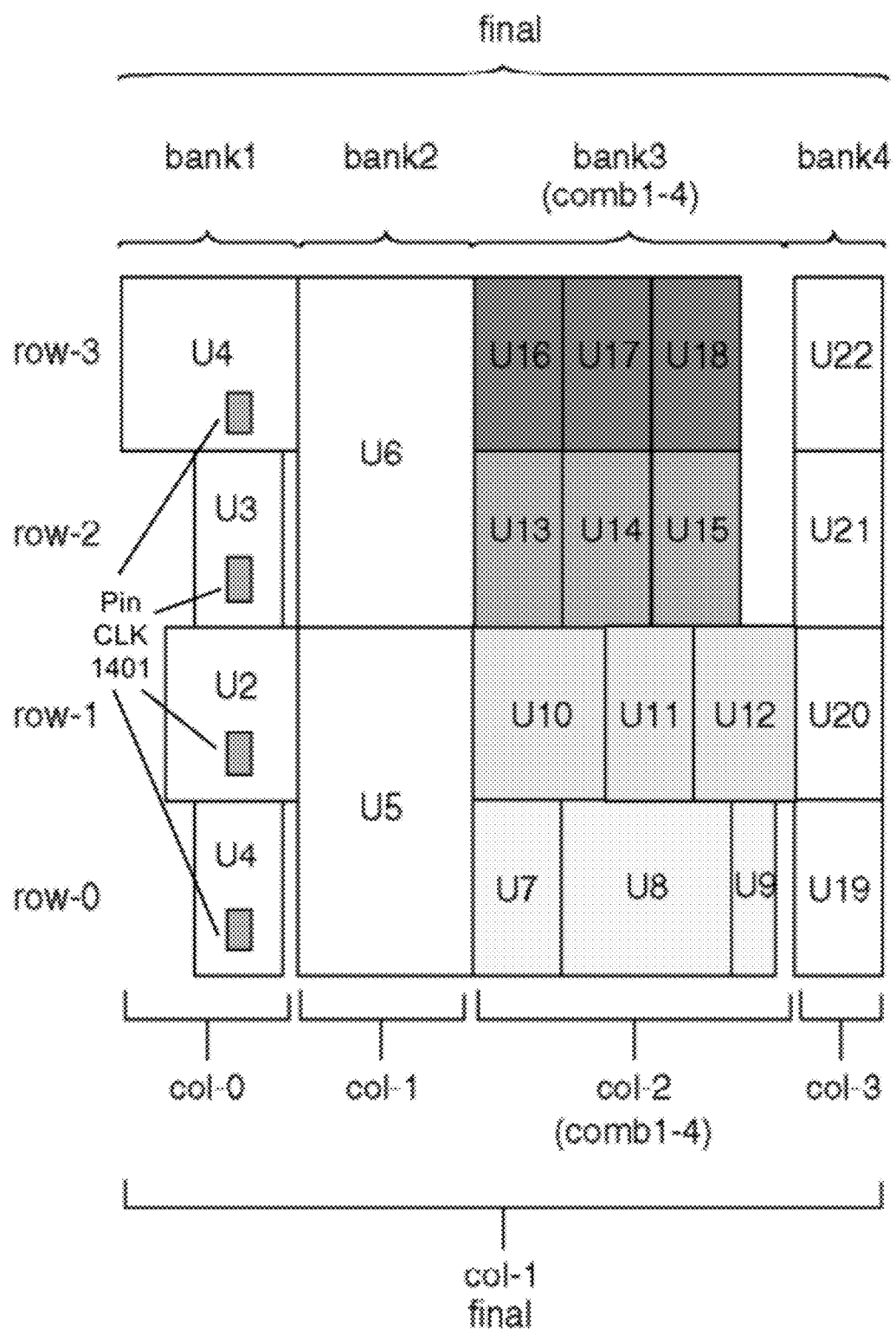
FIG. 14 shows a relative placement block of a circuit design that contains a group aligned by pins.

FIG. 14 shows a relative placement block that contains a group aligned by pins, in particular pin CLK 1401—the column named bank1 (col 0). It is included in the group named final. Group final can also be used further for instantiation or inclusion in another group.

The script in the example below provides the definition for the relative placement block shown in FIG. 14.

Example Definition for Hierarchical Relative Placement Block with Column Aligned by Pins

```
create_rp_group bank1 -design top -columns 1 -rows 4 -pin_name clk
    add_to_rp_group bank1 -leaf U1 -column 0 -row 0
    add_to_rp_group bank1 -leaf U2 -column 0 -row 1
    add_to_rp_group bank1 -leaf U3 -column 0 -row 2
    add_to_rp_group bank1 -leaf U4 -column 0 -row 3
create_rp_group bank2 -design top -columns 1 -rows 2
    add_to_rp_group bank2 -leaf U5 -column 0-row 0
    add_to_rp_group bank2 -leaf U6 -column 0-row 1
create_rp_group bank4 -design top -columns 1 -rows 4
    add_to_rp_group bank4 -leaf U19 -column 0 -row 0
    ...
    add_to_rp_group bank4 -leaf U22 -column 0 -row 3
create_rp_group comb1 -design top -columns 3 -rows 1
    add_to_rp_group comb1 -leaf U7 -column 0 -row 0
    add_to_rp_group comb1 -leaf U8 -column 1 -row 0
    add_to_rp_group comb1 -leaf U9 -column 2 -row 0
create_rp_group comb2 -design top -columns 3 -rows 1
    add_to_rp_group comb2 -leaf U10 -column 0 -row 0
    add_to_rp_group comb2 -leaf U11 -column 1 -row 0
    add_to_rp_group comb2 -leaf U12 -column 2 -row 0
create_rp_group comb3 -design top -columns 3 -rows 1
    add_to_rp_group comb3 -leaf U13 -column 0 -row 0
    add_to_rp_group comb3 -leaf U14 -column 1 -row 0
    add_to_rp_group comb3 -leaf U15 -column 2 -row 0
create_rp_group comb4 -design top -columns 3 -rows 1
    add_to_rp_group comb4 -leaf U16 -column 0 -row 0
    add_to_rp_group comb4 -leaf U17 -column 1 -row 0
    add_to_rp_group comb4 -leaf U18 -column 2 -row 0
create_rp_group bank3 -design top -columns 1 -rows 4
    add_to_rp_group bank3 -hierarchy comb1 -column 0 -row 0
    add_to_rp_group bank3 -hierarchy comb2 -column 0 -row 1
    ...
create_rp_group final -design top -columns 4 -rows 1
    add_to_rp_group final -hierarchy bank1 -column 0 -row 0
    add_to_rp_group final -hierarchy bank2 -column 1 -row 0
    add_to_rp_group final -hierarchy bank3 -column 2 -row 0
    add_to_rp_group final -hierarchy bank4 -column 3 -row 0
```

Anchoring Relative Placement Blocks at a Specified Location

A single relative placement block can be anchored at a location specified. Anchoring allows controlled placement of the relative placement block with respect to other relative placement blocks, macros, or to the edges and origin of the core area.

To anchor a relative placement group, use the create_rp_group command with its -x_offset and -y_offset switches.

When specifying an anchor point, one or more of the following points can apply:

Provide anchor points for top level groups. Anchor points are allowed at the top level.

Both the x- and y-coordinates or either the x- or y-coordinate can be specified. Specifying one coordinate as fixed allows the unspecified coordinate to slide. The offset is an integer, in microns, relative to the chip's origin.

If an anchor point outside the design boundary is specified, relative placement alignment for the block fails, a warning appears, and the cells are clustered inside the boundary.

If an anchor point is specified for a group that is not a top-level group or that causes placement that is not valid, a warning appears and relative placement continues.

Figure 15:
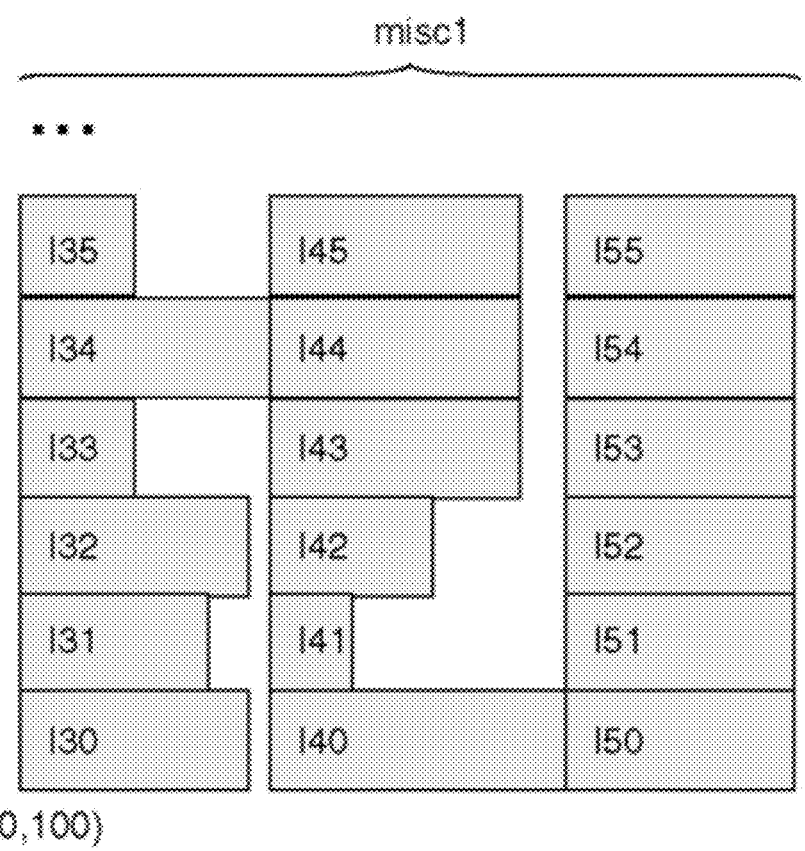
FIG. 15 shows a relative placement block of a circuit design anchored at the x-coordinate and the y-coordinate.

FIG. 15 shows a relative placement block anchored at both the x-coordinate and the y-coordinate.

The script in the example below provides the definition for anchoring relative placement block misc1 in block 1 at both x-coordinate 100 and y-coordinate 100. (In both the figure and the example, not all rows are shown.)

Example Definition for Anchoring a Group Using Two Coordinates

```
create_rp_group misc1 -design block1 -columns 3 -rows 10
    -x_offset 100 -y_offset 100
    add_to_rp_group misc1 -leaf I30 -column 0 -row 0
    add_to_rp_group misc1 -leaf I31 -column 0 -row 1
    add_to_rp_group misc1 -leaf I32 -column 0 -row 2
    add_to_rp_group misc1 -leaf I33 -column 0 -row 3
    add_to_rp_group misc1 -leaf I34 -column 0 -row 4
    add_to_rp_group misc1 -leaf I35 -column 0 -row 5
    ...
```

Figure 16:
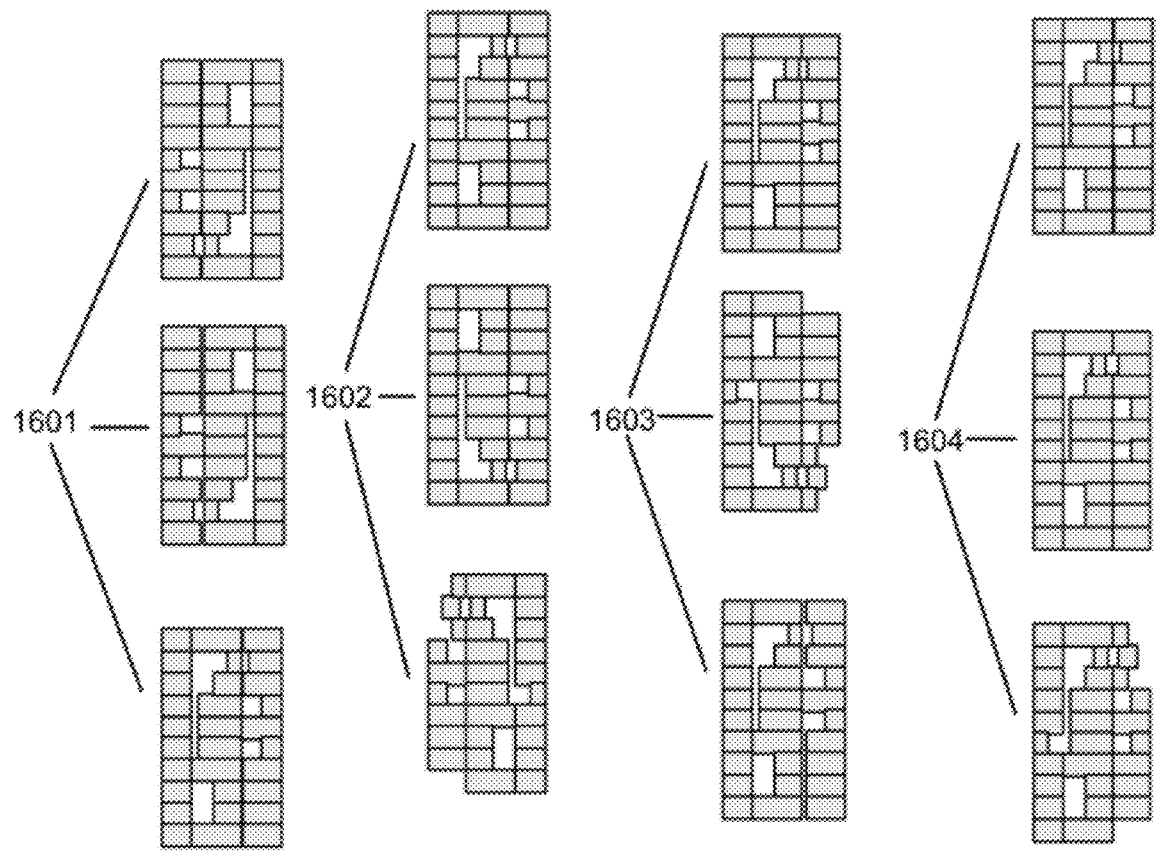
FIG. 16 shows multiple relative placement blocks of a circuit design aligned and anchored vertically at four coordinates.

FIG. 16 shows 12 relative placement blocks aligned and anchored vertically at four coordinates. Blocks 1, 2, and 3 1601 have -x_offset 100. Blocks 4, 5, and 6 1602 have -x_offset 200. Blocks 7, 8, and 9 1603 have -x_offset 300. Blocks 10, 11, and 12 1604 have -x_offset 400.

The script in the example below defines the locations of the 12 vertically aligned and anchored relative placement blocks shown in FIG. 16. For brevity, not every group is listed in the example.

Example Definitions for Locations of Vertically Aligned and Anchored Blocks

```
create_rp_group block1 -design misc1 -columns 3 -rows 10 -x_offset 100
create_rp_group block2 -design misc1 -columns 3 -rows 10 -x_offset 100
create_rp_group block3 -design misc1 -columns 3 -rows 10 -x_offset 100
create_rp_group block4 -design misc1 -columns 3 -rows 10 -x_offset 200
create_rp_group block5 -design misc1 -columns 3 -rows 10 -x_offset 200
create_rp_group block6 -design misc1 -columns 3 -rows 10 -x_offset 200
...
create_rp_group block12 -design misc1 -columns 3 -rows 10 -x_offset 400
```

Using Compression to Remove Empty Space in a Relative Placement Group

By default, construction for relative placement aligns cells from their bottom-left corner. Compression removes empty space in rows to create a more compact structure. The compressed columns are no longer aligned and utilization is higher in the area of the compressed cells.

If compression is needed, use hierarchical relative placement to construct the pattern, using the syntax for hierarchical inclusion.

Figure 17:
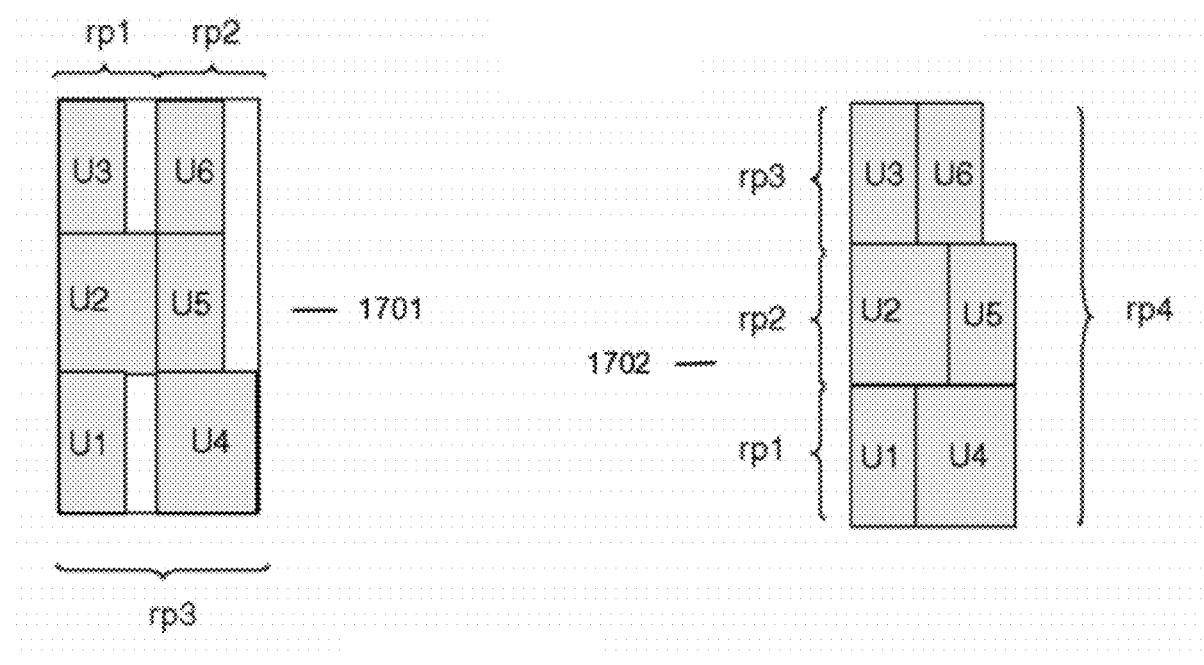
FIG. 17 shows circuit elements with and without compression specified by relative placement rules.

FIG. 17 shows the same cells aligned without compression 1701 and with compression 1702. The cells are bottom-left aligned.

Alternatively, compression can be accomplished by using bit-stack placement. Set the variable physopt_bit_stacked_placement to true (the default is false). Setting this variable to true causes the empty space to be removed, compressing the group as shown in FIG. 17. The columns are no longer aligned and utilization is higher.

Relative Placement in a Design Containing Obstructions

During placement, relative placement groups can avoid placement keepouts (obstructions) that are defined in the PDEF file or created by a the placement, routing, and optimization tool keepout command (create_placement_keepout, create_wiring_keepout). A relative placement group can be broken into pieces that straddle obstructions.

Figure 18:
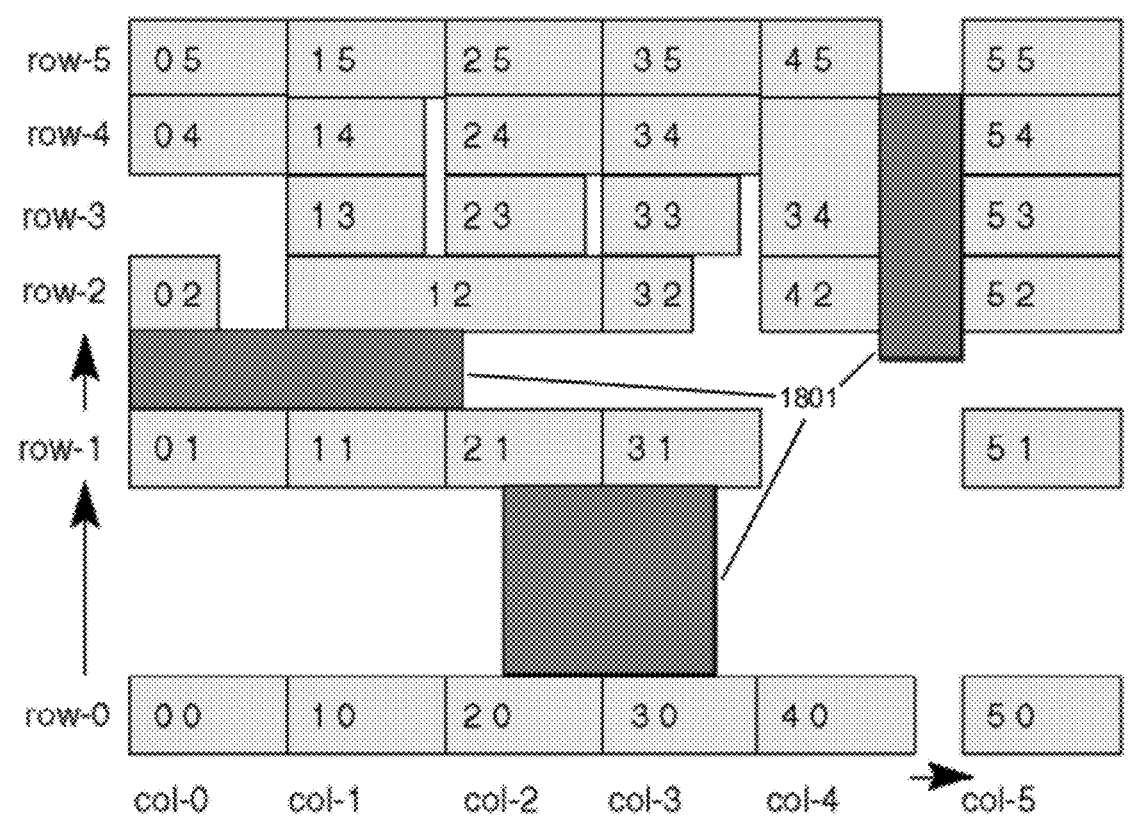

FIG. 18 shows the placement of relative placement cells in a design containing keepouts 1801 that were either defined in the PDEF file or created by a the placement, routing, and optimization tool keepout command. Rows 0 and 2 and column 5 are placed to avoid the keepouts but relative placement alignment is maintained.

Converting rp_reader Syntax to Tcl Syntax

Use the following transformations to convert existing rp_reader text files to Tcl syntax to use within the placement, routing, and optimization tool:

Change the keyword group to the create_rp_group command

Insert the add_to_rp_group command before each item in a group

Change the keyword keepout to -keepout

Change the keyword hierarchy to -hierarchy

Change the keyword leaf to -leaf

Insert the -design switch before the design name when creating a relative placement group Insert the -column and -row switches in front of those values Insert the -width and -height switches in front of those values Alternatively, the following command can be used that runs a script to do the conversion:

rp_reader dbfile out.tcl -tcl_export

The following tables show the rp_reader file format elements for groups, leaf cells, hierarchy groups, and keepouts.

Group

| group | misc | top | 9 | 10 |
|---|---|---|---|---|
| keyword | group name | design name | number of columns | number of rows |

Leaf Cell

| custom | leaf | U0 | 0 | 0 |
|---|---|---|---|---|
| group name | keyword | instance name | column position | row position |

Hierarchy Group for Inclusion

| rp4 | hier | rp1 | 0 | 0 |
|---|---|---|---|---|
| group name | keyword | subgroup name | column position | row position |

Hierarchy Group for Instantiation

| rp2 | hier | rp1 | (U3) | 0 | 0 |
|---|---|---|---|---|---|
| group name | keyword | subgroup name | instance name | column position | row position |

Keepout

| misc | keep | gap4 | 3 | 2 | 5 | 1 |
|---|---|---|---|---|---|---|
| group name | keyword | keepout name | column position | row position | width | height |

Figure 19:
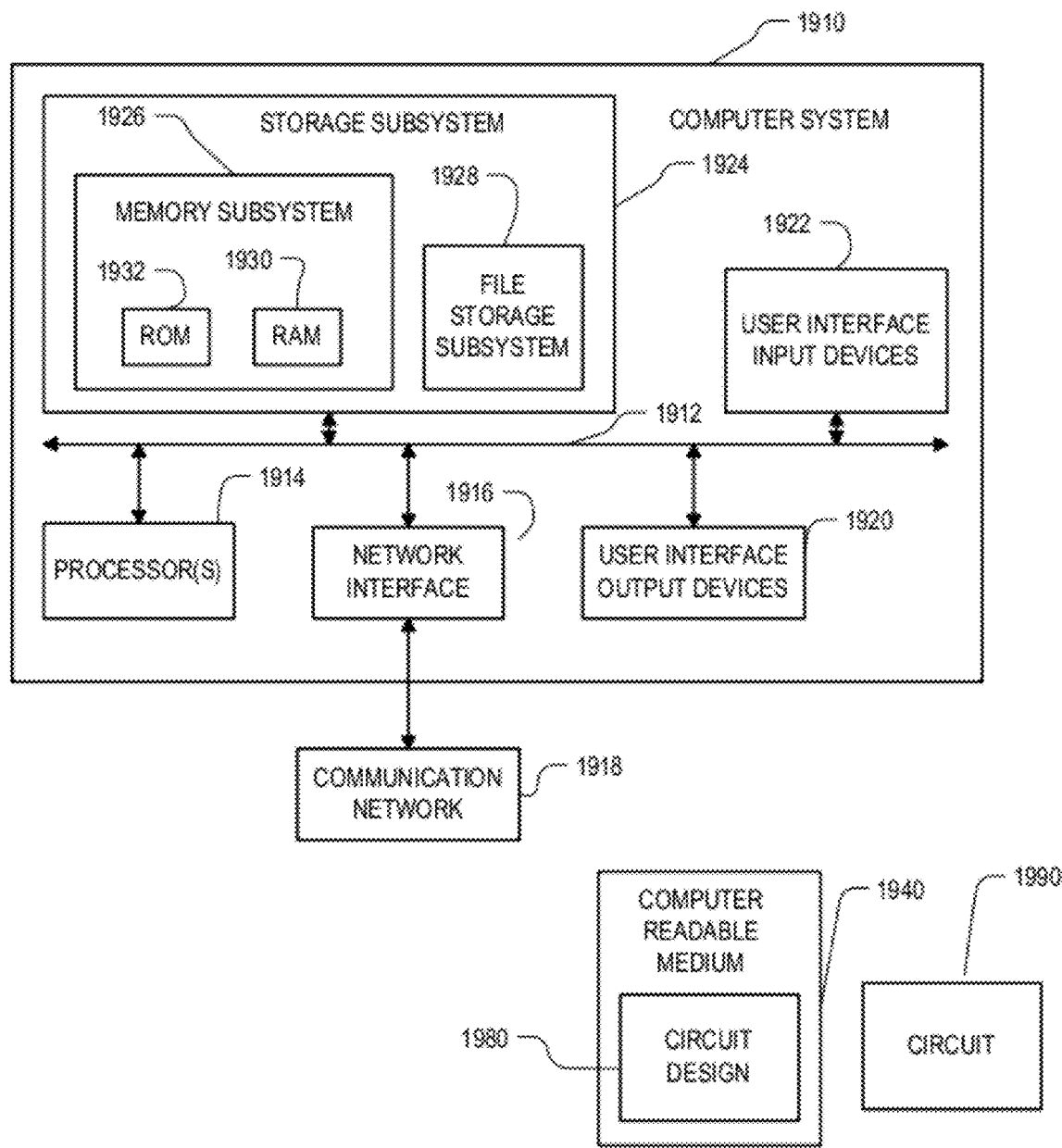
FIG. 19 is a simplified block diagram of a computer system suitable for use with embodiments of the technology, as well as a circuit design and circuit embodiments of the technology.

FIG. 19 is a simplified block diagram of a computer system 1910 suitable for use with embodiments of the technology. Computer system 1910 typically includes at least one processor 1914 which communicates with a number of peripheral devices via bus subsystem 1912. These peripheral devices may include a storage subsystem 1924, comprising a memory subsystem 1926 and a file storage subsystem 1928, user interface input devices 1922, user interface output devices 1920, and a network interface subsystem 1916. The input and output devices allow user interaction with computer system 1910. Network interface subsystem 1916 provides an interface to outside networks, including an interface to communication network 1918, and is coupled via communication network 1918 to corresponding interface devices in other computer systems. Communication network 1918 may comprise many interconnected computer systems and communication links. These communication links may be wireline links, optical links, wireless links, or any other mechanisms for communication of information. While in one embodiment, communication network 1918 is the Internet, in other embodiments, communication network 1918 may be any suitable computer network.

User interface input devices 1922 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 1910 or onto computer network 1918.

User interface output devices 1920 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 1910 to the user or to another machine or computer system.

Storage subsystem 1924 stores the basic programming and data constructs that provide the functionality of certain embodiments of the present invention. For example, the various modules implementing the functionality of certain embodiments of the invention may be stored in storage subsystem 1924. These software modules are generally executed by processor 1914.

Memory subsystem 1926 typically includes a number of memories including a main random access memory (RAM) 1930 for storage of instructions and data during program execution and a read only memory (ROM) 1932 in which fixed instructions are stored. File storage subsystem 1928 provides persistent storage for program and data files, and may include a hard disk drive, a floppy disk drive along with associated removable media, a CD-ROM drive, an optical drive, or removable media cartridges. The databases and modules implementing the functionality of certain embodiments of the invention may be stored by file storage subsystem 1928.

Bus subsystem 1912 provides a mechanism for letting the various components and subsystems of computer system 1910 communicate with each other as intended. Although bus subsystem 1912 is shown schematically as a single bus, alternative embodiments of the bus subsystem may use multiple busses.

Computer readable medium 1940 can be a medium associated with file storage subsystem 1928, and/or with network interface 1916. The computer readable medium can be a hard disk, a floppy disk, a CD-ROM, an optical medium, removable media cartridge, or electromagnetic wave. The computer readable medium 1940 is shown storing a circuit design 1980 created with the described technology. Also shown is a circuit 1990 created with the described technology.

Computer system 1910 itself can be of varying types including a personal computer, a portable computer, a workstation, a computer terminal, a network computer, a television, a mainframe, or any other data processing system or user device. Due to the ever-changing nature of computers and networks, the description of computer system 1910 depicted in FIG. 19 is intended only as a specific example for purposes of illustrating the preferred embodiments of the present invention. Many other configurations of computer system 1910 are possible having more or less components than the computer system depicted in FIG. 19.

While the present invention is disclosed by reference to the embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A non-transitory computer readable medium with computer readable instructions for circuit design, comprising:
   computer instructions generating a placed, routed, and optimized circuit design, including:
      computer instructions placing and routing a netlist of a circuit design including a first set of circuit elements; and
      computer instructions optimizing at least part of the first set of circuit elements,
   wherein the placed, routed, and optimized circuit design obeys rules specifying positioning of each circuit element of the first set of circuit elements relative to other circuit elements of the first set of circuit elements, and the rules were created after creating the first set of circuit elements,
   wherein the netlist of the circuit design further includes a second set of circuit elements of the circuit design, and the placed, routed, and optimized circuit design obeys additional rules specifying positioning of each circuit element of the second set of circuit elements relative to other circuit elements of the second set of circuit elements, the additional rules being created specifically for the second set of circuit elements prior to the placing and routing of the second set of circuit elements, and the generating further includes optimizing at least part of the second set of circuit elements.

2. The non-transitory computer readable medium of claim 1, wherein the netlist of the circuit design further includes the second set of circuit elements of the circuit design unconstrained by the rules.

3. The non-transitory computer readable medium of claim 1, wherein the netlist of the circuit design further includes the second set of circuit elements of the circuit design unconstrained by the rules, and the second set of circuit elements includes one or more of a macro, a memory, and random logic of the circuit design.

4. The non-transitory computer readable medium of claim 1, wherein the netlist of the circuit design further includes the second set of circuit elements of the circuit design unconstrained by the rules, and said placing and routing randomly places the second set of circuit elements in the circuit design.

5. The non-transitory computer readable medium of claim 1, wherein the netlist of the circuit design further includes the second set of circuit elements of the circuit design unconstrained by the rules, and the generating further includes optimizing at least part of the second set of circuit elements of the circuit design.

6. The non-transitory computer readable medium of claim 1, wherein the netlist of the circuit design further includes the second set of circuit elements of the circuit design unconstrained by the rules, and the generating further includes optimizing at least part of the second set of circuit elements, and the optimizing of the first set of circuit elements is affected by the optimizing of the second set of circuit elements.

7. The non-transitory computer readable medium of claim 1, wherein the netlist of the circuit design further includes the second set of circuit elements of the circuit design unconstrained by the rules, and the generating further includes optimizing at least part of the second set of circuit elements, and the optimizing of the second set of circuit elements is affected by the optimizing of the first set of circuit elements.

8. A computer readable storage device storing a computer readable program executable by a computer to perform a circuit design comprising:
   a placed, routed, and optimized circuit design, wherein the placed, routed, and optimized circuit design is created by:
      placing and routing a netlist of the circuit design including a first set of circuit elements; and
      optimizing at least part of the first set of circuit elements,
   wherein the placed, routed, and optimized circuit design obeys rules specifying positioning of each circuit element of the first set of circuit elements relative to other circuit elements of the first set of circuit elements, and the rules were created after creating the first set of circuit elements,
   wherein the netlist of the circuit design further includes a second set of circuit elements of the circuit design, and the placed, routed, and optimized circuit design obeys additional rules specifying positioning of each circuit element of the second set of circuit elements relative to other circuit elements of the second set of circuit elements, the additional rules being created specifically for the second set of circuit elements prior to the placing and routing of the second set of circuit elements, and the generating further includes optimizing at least part of the second set of circuit elements.

9. The computer readable storage device of claim 8, wherein the netlist of the circuit design further includes the second set of circuit elements of the circuit design unconstrained by the rules.

10. The computer readable storage device of claim 8, wherein the netlist of the circuit design further includes the second set of circuit elements of the circuit design unconstrained by the rules, and the second set of circuit elements includes one or more of a macro, a memory, and random logic of the circuit design.

11. The computer readable storage device of claim 8, wherein the netlist of the circuit design further includes the second set of circuit elements of the circuit design unconstrained by the rules, and said placing and routing randomly places the second set of circuit elements in the circuit design.

12. The computer readable storage device of claim 8, wherein the netlist of the circuit design further includes the second set of circuit elements of the circuit design unconstrained by the rules, and the generating further includes optimizing at least part of the second set of circuit elements of the circuit design.

13. The computer readable storage device of claim 8, wherein the netlist of the circuit design further includes the second set of circuit elements of the circuit design unconstrained by the rules, and the generating further includes optimizing at least part of the second set of circuit elements, and the optimizing of the first set of circuit elements is affected by the optimizing of the second set of circuit elements.

14. The computer readable storage device of claim 8, wherein the netlist of the circuit design further includes the second set of circuit elements of the circuit design unconstrained by the rules, and the generating further includes optimizing at least part of the second set of circuit elements, and the optimizing of the second set of circuit elements is affected by the optimizing of the first set of circuit elements.

15. An electrical circuit, comprising:
    circuitry including a placed, routed, and optimized circuit, wherein the placed, routed, and optimized circuit was designed by:
        placing and routing a netlist of the circuit including a first set of circuit elements; and
        optimizing at least part of the first set of circuit elements, wherein the placed, routed, and optimized circuit design obeys rules specifying positioning of each circuit element of the first set of circuit elements relative to other circuit elements of the first set of circuit elements, and the rules were created after creating the first set of circuit elements,
    wherein the netlist of the circuit design further includes a second set of circuit elements of the circuit design, and the placed, routed, and optimized circuit design obeys additional rules specifying positioning of each circuit element of the second set of circuit elements relative to other circuit elements of the second set of circuit elements, the additional rules being created specifically for the second set of circuit elements prior to the placing and routing of the second set of circuit elements, and the generating further includes optimizing at least part of the second set of circuit elements.

16. The electrical circuit of claim 15, wherein the netlist of the circuit design further includes the second set of circuit elements of the circuit design unconstrained by the rules.

17. The electrical circuit of claim 15, wherein the netlist of the circuit design further includes the second set of circuit elements of the circuit design unconstrained by the rules, and the second set of circuit elements includes one or more of a macro, a memory, and random logic of the circuit design.

18. The electrical circuit of claim 15, wherein the netlist of the circuit design further includes the second set of circuit elements of the circuit design unconstrained by the rules, and said placing and routing randomly places the second set of circuit elements in the circuit design.

19. The electrical circuit of claim 15, wherein the netlist of the circuit design further includes the second set of circuit elements of the circuit design unconstrained by the rules, and the generating further includes optimizing at least part of the second set of circuit elements of the circuit design.

20. The electrical circuit of claim 15, wherein the netlist of the circuit design further includes the second set of circuit elements of the circuit design unconstrained by the rules, and the generating further includes optimizing at least part of the second set of circuit elements, and the optimizing of the first set of circuit elements is affected by the optimizing of the second set of circuit elements.

* * * * *